United States Patent
Hatano

(10) Patent No.: US 9,000,443 B2
(45) Date of Patent: Apr. 7, 2015

(54) LIGHT-EMITTING DEVICE, FLEXIBLE LIGHT-EMITTING DEVICE, ELECTRONIC DEVICE, LIGHTING APPARATUS, AND METHOD OF MANUFACTURING LIGHT-EMITTING DEVICE AND FLEXIBLE-LIGHT EMITTING DEVICE

(75) Inventor: Kaoru Hatano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 174 days.

(21) Appl. No.: 13/005,768

(22) Filed: Jan. 13, 2011

(65) Prior Publication Data
US 2011/0175102 A1    Jul. 21, 2011

(30) Foreign Application Priority Data
Jan. 20, 2010    (JP) .................................. 2010-010421

(51) Int. Cl.
*H01L 27/14* (2006.01)
*H01L 51/52* (2006.01)
(Continued)

(52) U.S. Cl.
CPC ........... *H01L 51/529* (2013.01); *H01L 27/1225* (2013.01); *H01L 27/1266* (2013.01); *H01L 27/3209* (2013.01); *H01L 27/322* (2013.01);
(Continued)

(58) Field of Classification Search
USPC .............. 257/72, 100, 43, E33.001, E33.053, 257/E33.059, E33.075; 438/22, 34
See application file for complete search history.

(56) References Cited

U.S. PATENT DOCUMENTS

| | | | |
|---|---|---|---|
| 5,107,175 | A | 4/1992 | Hirano et al. |
| 5,124,204 | A | 6/1992 | Yamashita et al. |

(Continued)

FOREIGN PATENT DOCUMENTS

| | | |
|---|---|---|
| CN | 001832179 A | 9/2006 |
| CN | 001895003 A | 1/2007 |

(Continued)

OTHER PUBLICATIONS

Kim et al. "Thin Film Passivation for Longevity of Organic Light-Emitting Devices and Organic Thin-Film Transistor," IDW '03, pp. 387-390, Dec. 3, 2003.

(Continued)

*Primary Examiner* — Vongsavanh Sengdara
(74) *Attorney, Agent, or Firm* — Eric J. Robinson; Robinson Intellectual Property Law Office, P.C.

(57) ABSTRACT

An object is to provide a light-emitting device or a flexible light-emitting device having low surface temperature, a long lifetime, and high reliability. Another object is to provide a simple method of manufacturing the light-emitting device or the flexible light-emitting device. Provided is a light-emitting device or a flexible light-emitting device which includes: a substrate having a light-transmitting property with respect to visible light; a first adhesive layer provided over the substrate; an insulating layer located over the first adhesive layer; a light-emitting element comprising a first electrode formed over the insulating layer, a second electrode facing the first electrode, and a layer including an organic compound having a light-emitting property between the first electrode and the second electrode, a second adhesive layer formed over the second electrode; a metal substrate provided over the second adhesive layer; and a heat radiation material layer formed over the metal substrate.

95 Claims, 11 Drawing Sheets

(51) Int. Cl.
*H01L 27/12* (2006.01)
*H01L 27/32* (2006.01)

(52) U.S. Cl.
CPC ......... *H01L 27/3244* (2013.01); *H01L 27/3281* (2013.01); H01L 51/5243 (2013.01); *H01L 51/5268* (2013.01); *H01L 51/5275* (2013.01); *H01L 51/5278* (2013.01); *H01L 2227/326* (2013.01); *H01L 2251/5338* (2013.01); *H01L 2251/5361* (2013.01); *H01L 2251/5369* (2013.01)

(56) References Cited

U.S. PATENT DOCUMENTS

| | | | |
|---|---|---|---|
| 5,189,405 A | | 2/1993 | Yamashita et al. |
| 5,473,511 A * | | 12/1995 | Reddy et al. ............... 361/719 |
| 5,686,360 A | | 11/1997 | Harvey et al. |
| 5,693,956 A | | 12/1997 | Shi et al. |
| 5,751,063 A * | | 5/1998 | Baba ............................ 257/723 |
| 5,757,126 A | | 5/1998 | Harvey et al. |
| 5,771,562 A | | 6/1998 | Harvey et al. |
| 5,811,177 A | | 9/1998 | Shi et al. |
| 5,952,778 A | | 9/1999 | Haskal et al. |
| 6,146,225 A | | 11/2000 | Sheats et al. |
| 6,150,187 A | | 11/2000 | Zyung et al. |
| 6,198,217 B1 | | 3/2001 | Suzuki et al. |
| 6,198,220 B1 | | 3/2001 | Jones et al. |
| 6,239,470 B1 | | 5/2001 | Yamazaki |
| 6,294,478 B1 | | 9/2001 | Sakaguchi et al. |
| 6,372,608 B1 | | 4/2002 | Shimoda et al. |
| 6,413,645 B1 | | 7/2002 | Graff et al. |
| 6,441,468 B1 | | 8/2002 | Yamazaki |
| 6,492,026 B1 | | 12/2002 | Graff et al. |
| 6,506,664 B1 | | 1/2003 | Beyne et al. |
| 6,521,511 B1 | | 2/2003 | Inoue et al. |
| 6,522,067 B1 | | 2/2003 | Graff et al. |
| 6,977,394 B2 | | 12/2005 | Yamazaki et al. |
| 7,067,392 B2 | | 6/2006 | Yamazaki et al. |
| 7,178,927 B2 | | 2/2007 | Seo |
| 7,190,115 B2 | | 3/2007 | Tsuchiya et al. |
| 7,229,900 B2 | | 6/2007 | Takayama et al. |
| 7,268,487 B2 | | 9/2007 | Yamazaki et al. |
| 7,332,381 B2 | | 2/2008 | Maruyama et al. |
| 7,446,336 B2 | | 11/2008 | Yamazaki et al. |
| 7,486,368 B2 | | 2/2009 | Sakakura et al. |
| 7,495,256 B2 | | 2/2009 | Yamazaki et al. |
| 7,532,173 B2 | | 5/2009 | Yamazaki et al. |
| 7,566,633 B2 | | 7/2009 | Koyama et al. |
| 7,619,258 B2 | | 11/2009 | Tsuchiya et al. |
| 7,648,862 B2 | | 1/2010 | Maruyama et al. |
| 7,906,784 B2 | | 3/2011 | Koyama et al. |
| 8,013,335 B2 | | 9/2011 | Yamazaki et al. |
| 8,134,153 B2 | | 3/2012 | Yamazaki et al. |
| 8,188,474 B2 | | 5/2012 | Hatano et al. |
| 8,525,171 B2 | | 9/2013 | Yamazaki et al. |
| 2001/0020922 A1 | | 9/2001 | Yamazaki et al. |
| 2002/0012587 A1 | | 1/2002 | Farrar et al. |
| 2002/0125817 A1 | | 9/2002 | Yamazaki et al. |
| 2002/0149320 A1 * | | 10/2002 | Maruyama et al. ........ 315/169.3 |
| 2003/0025118 A1 * | | 2/2003 | Yamazaki et al. .............. 257/79 |
| 2003/0034497 A1 * | | 2/2003 | Yamazaki et al. .............. 257/86 |
| 2004/0105052 A1 * | | 6/2004 | Uekita et al. .................. 349/112 |
| 2005/0046346 A1 | | 3/2005 | Tsuchiya et al. |
| 2005/0206796 A1 * | | 9/2005 | Okabe ............................ 349/43 |
| 2006/0145603 A1 | | 7/2006 | Taniguchi et al. |
| 2006/0226773 A1 * | | 10/2006 | Kim et al. ...................... 313/512 |
| 2007/0159099 A1 | | 7/2007 | Takahashi et al. |
| 2007/0222370 A1 | | 9/2007 | Zhu et al. |
| 2007/0254456 A1 | | 11/2007 | Maruyama et al. |
| 2008/0122052 A1 * | | 5/2008 | Fukui ............................ 257/678 |
| 2008/0211402 A1 * | | 9/2008 | DeCook et al. ................ 313/511 |
| 2008/0238302 A1 * | | 10/2008 | Sung et al. ..................... 313/504 |
| 2008/0254296 A1 * | | 10/2008 | Handa et al. .................. 428/408 |
| 2009/0023232 A1 | | 1/2009 | Taniguchi et al. |
| 2009/0035899 A1 * | | 2/2009 | Herman et al. ............... 438/151 |
| 2009/0315026 A1 | | 12/2009 | Jeong et al. |
| 2009/0317968 A1 | | 12/2009 | Nagata |
| 2010/0059757 A1 | | 3/2010 | Kim et al. |
| 2010/0091202 A1 * | | 4/2010 | Ostergard ....................... 349/11 |
| 2010/0096633 A1 | | 4/2010 | Hatano et al. |
| 2010/0148179 A1 | | 6/2010 | Maruyama et al. |
| 2010/0258839 A1 | | 10/2010 | Matsue |
| 2011/0001146 A1 | | 1/2011 | Yamazaki et al. |
| 2011/0018416 A1 | | 1/2011 | Sassa |
| 2011/0175101 A1 | | 7/2011 | Hatano et al. |
| 2014/0001626 A1 | | 1/2014 | Yamazaki et al. |

FOREIGN PATENT DOCUMENTS

| | | |
|---|---|---|
| CN | 101009362 A | 8/2007 |
| CN | 101064247 A | 10/2007 |
| EP | 2136406 A | 12/2009 |
| EP | 2282607 A | 2/2011 |
| EP | 1554757 A | 6/2012 |
| JP | 63-056625 | 3/1988 |
| JP | 63-314522 | 12/1988 |
| JP | 10-090705 | 4/1998 |
| JP | 2003-204049 | 7/2003 |
| JP | 2004-140267 A | 5/2004 |
| JP | 2005-101025 | 4/2005 |
| JP | 2006-331695 A | 12/2006 |
| JP | 2008-010211 | 1/2008 |
| JP | 2008-013721 A | 1/2008 |
| JP | 2009-218117 | 9/2009 |
| JP | 2009-245770 A | 10/2009 |
| JP | 2010-004000 A | 1/2010 |
| WO | WO-2004/036652 | 4/2004 |
| WO | WO-2005/064993 | 7/2005 |

OTHER PUBLICATIONS

Jin et al., "64.1: 5.6-Inch Flexible Full Color Top Emission AMOLED Display on Stainless Steel Foil," SID Digest '06, vol. 37, pp. 1855-1857, Jun. 6, 2006.

Chwang, "64.2: Full Color 100 dpi AMOLED Displays on Flexible Stainless Steel Substrates," SID Digest '06, vol. 37, pp. 1858-1861 Jun. 6, 2006.

Chinese Office Action (Application No. 201110030955.8) dated Sep. 19, 2014.

\* cited by examiner

| | radius of cylinder around which flexible light-emitting device is wrapped | | |
|---|---|---|---|
| | 15mm | 10mm | 7.5mm |
| while being bent |  |  |  |
| flat after bent |  |  |  |

LIGHT-EMITTING DEVICE, FLEXIBLE LIGHT-EMITTING DEVICE, ELECTRONIC DEVICE, LIGHTING APPARATUS, AND METHOD OF MANUFACTURING LIGHT-EMITTING DEVICE AND FLEXIBLE-LIGHT EMITTING DEVICE

BACKGROUND OF THE INVENTION

1. Field of the Invention

The present invention relates to a light-emitting device, a flexible light-emitting device and a method of manufacturing the same. Further, the present invention relates to an electronic device and a lighting device on each of which the light-emitting device or the flexible light-emitting device is mounted.

2. Description of the Related Art

In recent years, technological development has been remarkably made in the field of displays. In particular, the needs of the market have stimulated tremendous progress in the technology directed to higher definition and reduced thickness.

In the next phase of this field, the focus is on commercialization of flexible displays, and a variety of proposals have been made for making displays flexible (for example, see Patent Document 1). Light-emitting devices using flexible substrates can be very light in weight compared with those using glass substrates or the like.

However, the biggest problem with practical application of such flexible displays is their lifetime.

This is because, as a substrate that should support light-emitting elements and protect the elements from moisture, oxygen, or the like in the surroundings, a glass substrate which is not flexible cannot be used and instead, a plastic substrate which is flexible but has high water permeability and low heat resistance has to be used. Since the heat resistance of a plastic substrate is low, a high quality protective film obtained by a high-temperature process cannot be formed. Moisture penetration through the plastic substrate adversely affects the lifetime of the light-emitting elements and further the light-emitting device to a great extent. For example, Non-Patent Document 1 introduces an example of the fabrication of a flexible light-emitting device in which a light-emitting element is formed over a substrate containing polyethersulfone (PES) as a base and is sealed with an aluminum film; however, the light-emitting device has a lifetime of about 230 hours, which is far from its practical use. Non-Patent Documents 2 and 3 each introduce an example of a flexible light-emitting device in which a light-emitting element is formed over a stainless steel substrate. In these examples, while moisture penetration through the stainless steel substrate is suppressed, moisture penetration from the light-emitting element side cannot be effectively prevented; therefore, the flexible light-emitting device is fabricated over the stainless steel substrate and a sealing film, in which layers of many kinds of materials are repeatedly stacked, is employed on the light-emitting element side so as to attempt to improve the lifetime.

Although a metal thin film such as an aluminum film or a stainless steel substrate has both flexibility and low water permeability, it does not transmit visible light therethrough with a normal thickness. Hence, in the light-emitting device, a metal thin film or a stainless steel substrate is used for only one of a pair of substrates between which a light-emitting element is interposed.

REFERENCES

Patent Document

[Patent Document 1]
  Japanese Published Patent Application No. 2003-204049

Non-Patent Documents

Non-Patent Document 1
  Gi Heon Kim et al., IDW'03, 2003, pp. 387-390
[Non-Patent Document 2]
  Dong Un Jin et al., SID 06 DIGEST, 2006, pp. 1855-1857
[Non-Patent Document 3]
  Anna Chwang et al., SID 06 DIGEST, 2006, pp. 1858-1861

SUMMARY OF THE INVENTION

In Non-Patent Document 1, the short lifetime is attributed to the failure to prevent moisture penetration through the PES substrate, although moisture penetration from the upper portion sealed with an aluminum film is suppressed. In addition, since the light-emitting element used for such a light-emitting device has a low heat resistance, a high quality protective film is difficult to form after the light-emitting element is formed.

In Non-Patent Documents 2 and 3, the lifetime of the light-emitting device appears the same as that of a light-emitting device interposed between glass substrates; however, this is achieved by the use of the sealing film in which layers of many kinds of materials are repeatedly stacked as described above, and the productivity is low. The low productivity makes it difficult to provide inexpensive products on a mass scale, and inhibits contribution to industrial development.

Thus, in a flexible light-emitting device, a plastic substrate which has lower heat resistance than a conventionally-used glass substrate has been used, and accordingly, a dense protective film which is formed at high temperature has not been able to be used. Therefore, the lifetime of a light-emitting element or the light-emitting device is short. Furthermore, a sealing film used to make up for this situation is poor in productivity.

In addition, when a metal thin film such as an aluminum film or a stainless steel substrate is used for sealing, the surface temperature of a light-emitting display device is increased, which leads to a problem such as the breakdown of the light-emitting display device or a reduction in its reliability.

In view of the above, an object of one embodiment of the present invention is to provide a flexible light-emitting device having low surface temperature, a long lifetime, and high reliability. Another object is to provide an electronic device and a lighting device each including the flexible light-emitting device. Still another object is to provide a simple method of manufacturing the flexible light-emitting device.

The above problems can be solved with a flexible light-emitting device which is manufactured in the following manner: a protective film is formed over a substrate with high heat resistance such as a glass substrate at an appropriate temperature so as to have sufficiently low water permeability; and necessary components such as a transistor, an electrode of a light-emitting element, and a light-emitting element are formed over the protective film; the necessary components together with the protective film are then transferred to a plastic substrate; a metal substrate is bonded thereto using an adhesive; and a heat radiation material layer is formed over the metal substrate.

That is, one embodiment of the invention disclosed in this specification is a flexible light-emitting device which includes: a substrate having flexibility and a light-transmitting property with respect to visible light; a first adhesive layer provided over the substrate; an insulating layer located over the first adhesive layer; a light-emitting element having a first electrode formed over the insulating layer, a second electrode facing the first electrode, and a layer including an organic compound having a light-emitting property between the first electrode and the second electrode, a second adhesive layer formed over the second electrode; a metal substrate provided over the second adhesive layer; and a heat radiation material layer formed over the metal substrate.

Another embodiment of the invention disclosed in this specification is a flexible light-emitting device which includes: a substrate having flexibility and a light-transmitting property with respect to visible light; a first adhesive layer provided over the substrate; an insulating layer located over the first adhesive layer; a transistor provided over the insulating layer; an interlayer insulating layer covering the transistor; a light-emitting element having a first electrode which is provided over the interlayer insulating layer and electrically connected to a source electrode or a drain electrode of the transistor, a second electrode facing the first electrode, and a layer including an organic compound having a light-emitting property between the first electrode and the second electrode; a second adhesive layer formed over the second electrode; a metal substrate provided over the second adhesive layer; and a heat radiation material layer formed over the metal substrate.

Another embodiment of the invention disclosed in this specification is a flexible light-emitting device having any of the above structures which further includes: a pixel portion including the light-emitting element and the transistor; and a driver circuit portion including a transistor, which is provided outside the pixel portion. The transistor in the pixel portion and the transistor in the driver circuit portion are formed in the same steps.

Another embodiment of the invention disclosed in this specification is a flexible light-emitting device having any of the above structures, in which crystalline silicon is used for an active layer of the transistor. Another embodiment of the invention disclosed in this specification is a flexible light-emitting device having any of the above structures, in which an oxide semiconductor is used for an active layer of the transistor.

Another embodiment of the invention disclosed in this specification is a flexible light-emitting device having any of the above structures, in which the thermal emissivity of the heat radiation material layer is higher than that of the metal substrate. In particular, the thermal emissivity of the heat radiation material layer is preferably greater than or equal to 0.90.

In this specification, the "thermal emissivity" means the ratio of the amount of energy radiated from a surface of a substance at a certain temperature to the amount of energy radiated from a black body (a hypothetical substance which absorbs the whole amount of energy radiated thereto) at the same temperature.

Another embodiment of the invention disclosed in this specification is a flexible light-emitting device having any of the above structures, in which a film sealing layer is formed between the second electrode of the light-emitting element and the second adhesive layer.

Another embodiment of the invention disclosed in this specification is a flexible light-emitting device having any of the above structures, in which the metal substrate includes a material selected from stainless steel, aluminum, copper, nickel, and an aluminum alloy.

Another embodiment of the invention disclosed in this specification is a flexible light-emitting device having any of the above structures, in which the first adhesive layer includes at least one or more materials such as an epoxy resin, an acrylic resin, a silicone resin, and a phenol resin.

Still another embodiment of the invention disclosed in this specification is a flexible light-emitting device having any of the above structures, in which the first adhesive layer includes a thermally conductive filler. The thermally conductive filler preferably has a higher thermal conductivity than another material used for the first adhesive layer, such as an organic resin.

Another embodiment of the invention disclosed in this specification is a flexible light-emitting device having the above structure, in which the second adhesive layer includes at least one or more selected from an epoxy resin, an acrylic resin, a silicone resin, and a phenol resin.

Still another embodiment of the invention disclosed in this specification is a flexible light-emitting device having any of the above structures, in which the second adhesive layer includes a thermally conductive filler. The thermally conductive filler preferably has a higher thermal conductivity than another material used for the second adhesive layer, such as an organic resin.

In addition, another embodiment of the invention disclosed in this specification is a flexible light-emitting device having any of the above structures, in which a resin layer is further provided between the metal substrate and the heat radiation material layer.

Another embodiment of the invention disclosed in this specification is a flexible light-emitting device having any of the above structures, in which the resin layer includes at least one or more thermosetting resins selected from an epoxy resin, an acrylic resin, a silicone resin, a phenol resin, and a polyester resin, or includes at least one or more thermoplastic resins selected from polypropylene, polyethylene, polycarbonate, polystyrene, polyamide, polyetherketone, a fluorine resin, and polyethylenenaphthalate.

Another embodiment of the invention disclosed in this specification is a flexible light-emitting device having any of the above structures, in which at least one of the substrate having flexibility and the property of transmitting visible light, the first adhesive layer, the second adhesive layer, and the resin layer includes further a fibrous body. As the fibrous body, a glass fiber is preferably used.

Another embodiment of the invention disclosed in this specification is a flexible light-emitting device having any of the above structures, in which a waterproof layer is formed between the substrate having flexibility and the property of transmitting visible light and the first adhesive layer. As the waterproof layer, a layer including silicon and nitrogen or a layer including aluminum and nitrogen is preferably used.

Another embodiment of the invention disclosed in this specification is a flexible light-emitting device having any of the above structures, in which the substrate having flexibility and the property of transmitting visible light includes a surface facing the metal substrate, and includes a surface being provided with a coat layer and opposite to the surface facing the metal substrate.

Another embodiment of the invention disclosed in this specification is a flexible light-emitting device having any of the above structures, in which the coat layer has a property of transmitting visible light and high hardness. Further, when a conductive film having a property of transmitting visible light is used for the coat layer, the flexible light-emitting device can be protected from static electricity.

Another embodiment of the invention disclosed in this specification is a flexible light-emitting device having any of the above structures, in which the insulating layer is a layer including nitrogen and silicon.

Another embodiment of the invention disclosed in this specification is an electronic device including the flexible light-emitting device having any of the above structures in a display portion.

Another embodiment of the invention disclosed in this specification is a lighting device including the flexible light-emitting device having any of the above structures.

Another embodiment of the invention disclosed in this specification is a method of manufacturing a flexible light-emitting device which includes the steps of: forming a separation layer over a formation substrate; forming an insulating layer over the separation layer; forming a first electrode over the insulating layer; forming a partition wall so as to cover an end portion of the first electrode over the first electrode; bonding a temporary supporting substrate onto the first electrode and the partition wall; separating the insulating layer, the first electrode, the partition wall, and the temporary supporting substrate from the formation substrate, between the separation layer and the insulating layer; bonding a substrate having flexibility and a property of transmitting visible light to a surface of the insulating film, which is exposed by the separating step, using a first adhesive layer; removing the temporary supporting substrate to expose a surface of the first electrode; forming a layer including an organic compound having a light-emitting property so as to cover the exposed first electrode; forming a second electrode so as to cover the layer including an organic compound having the light-emitting property; bonding a metal substrate to a surface of the second electrode using a second adhesive layer; and forming a heat radiation material layer over the metal substrate.

Another embodiment of the invention disclosed in this specification is a method of manufacturing a flexible light-emitting device which includes the steps of: forming a separation layer over a formation substrate; forming an insulating layer over the separation layer; forming a plurality of transistors over the insulating layer; forming an interlayer insulating layer over the transistors; forming a first electrode electrically connected to a source electrode or a drain electrode of each of the transistors over the interlayer insulating layer; forming a partition wall so as to cover an end portion of the first electrode; bonding a temporary supporting substrate onto the first electrode and the partition wall; separating the insulating layer, the transistors, the interlayer insulating layer, the first electrode, the partition wall, and the temporary supporting substrate from the formation substrate, between the separation layer and the insulating layer; bonding a substrate having flexibility and a property of transmitting visible light to a surface of the insulating film which is exposed by the separating step, using a first adhesive layer; removing the temporary supporting substrate to expose a surface of the first electrode; forming a layer including an organic compound having a light-emitting property so as to cover the exposed first electrode; forming a second electrode so as to cover the layer including an organic compound having the light-emitting property; bonding a metal substrate to a surface of the second electrode using a second adhesive layer; and forming a heat radiation material layer over the metal substrate.

According to another embodiment of the invention disclosed in this specification, a resin layer is formed between the metal substrate and the heat radiation material layer in any of the above methods of manufacturing a flexible light-emitting device.

According to another embodiment of the invention disclosed in this specification, a film sealing layer is formed between the second electrode and the second adhesive layer in any of the above methods of manufacturing a flexible light-emitting device.

According to another embodiment of the invention disclosed in this specification, the insulating layer is formed by a plasma CVD method at a temperature greater than or equal to 250° C. and less than or equal to 400° C. in any of the above methods of manufacturing a flexible light-emitting device.

One embodiment of the present invention can provide a flexible light-emitting device having low surface temperature, a long lifetime, and high reliability. Another embodiment of the present invention can provide an electronic device and a lighting device each including the flexible light-emitting device. Still another embodiment of the present invention can provide a simple method of manufacturing the flexible light-emitting device.

DETAILED DESCRIPTION OF THE INVENTION

Hereinafter, embodiments of the present invention will be described with reference to the accompanying drawings. However, the present invention can be carried out in many different modes, and it is easily understood by those skilled in the art that modes and details thereof can be modified in various ways without departing from the spirit and the scope of the present invention. Therefore, the present invention should not be interpreted as being limited to the description of the embodiments.

(Embodiment 1)

This embodiment will give descriptions of light-emitting devices of one embodiment of the present invention and a method of manufacturing a light-emitting device according to one embodiment of the present invention. First, the light-emitting devices of Embodiment 1 will be described with reference to FIGS. 1A to 1C.

Figure 1A:
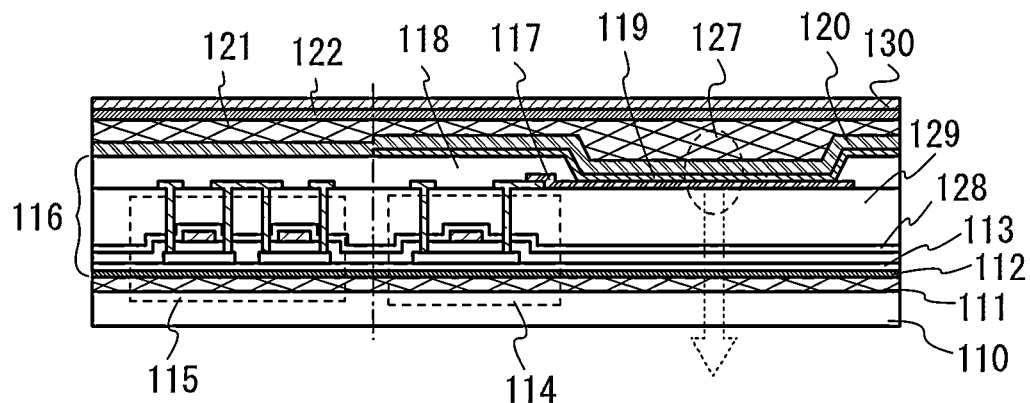
FIGS. 1A to 1C each illustrate a light-emitting device according to one embodiment.

FIG. 1A illustrates an example of a flexible light-emitting device. The flexible light-emitting device illustrated in FIG.

1A includes a plastic substrate 110, a first adhesive layer 111, a protective layer 112, a base insulating layer 113, a transistor 114 for a pixel portion, a transistor 115 for a driver circuit portion, a light-emitting element 127 (including a first electrode 117, a layer 119 containing an organic compound having a light-emitting property (hereinafter referred to as an EL (electroluminescence) layer), and a second electrode 120), a partition wall 118, a second adhesive layer 121, a metal substrate 122, a first interlayer insulating layer 128, a second interlayer insulating layer 129, and a heat radiation material layer 130.

The plastic substrate 110 and the protective layer 112 are bonded using the first adhesive layer 111. Over the protective layer 112, the base insulating layer 113, the transistor 114 for the pixel portion, the transistor 115 for the driver circuit portion, the first electrode 117 of the light-emitting element which is electrically connected to the transistor 114 for the pixel portion, and the partition wall 118 covering an end portion of the first electrode, which are partly illustrated in FIG. 1A, are provided. The light-emitting element 127 includes the first electrode 117 which is exposed from the partition wall 118, the EL layer 119 containing an organic compound having a light-emitting property which is formed so as to cover at least the first electrode 117, and the second electrode 120 which is provided to cover the EL layer 119. The metal substrate 122 is bonded onto the second electrode 120 with use of the second adhesive layer 121. Further, the heat radiation material layer 130 is formed over the metal substrate 122. Note that the driver circuit portion is not necessarily provided. Further, a CPU portion may be provided. In FIG. 1A, a layer 116 to be separated includes at least the protective layer 112, the base insulating layer 113, the transistor 114 for the pixel portion, the transistor 115 for the driver circuit portion, the first interlayer insulating layer 128, the second interlayer insulating layer 129, the first electrode 117, and the partition wall 118, but this is just an example which can be easily formed and the components included in the layer 116 to be separated are not limited thereto.

Since the flexible light-emitting device illustrated in FIG. 1A has the protective layer 112 and the metal substrate 122, it is possible to suppress moisture penetration from both a surface of the plastic substrate and a surface of the metal substrate, and thus a light-emitting device having a long lifetime can be realized. Further, the heat radiation material layer 130 formed over the metal substrate 122 makes it possible to suppress an increase in the surface temperature of the light-emitting device, thereby preventing the breakdown of the light-emitting device and a reduction in its reliability which are caused by heat generation.

Figure 1B:
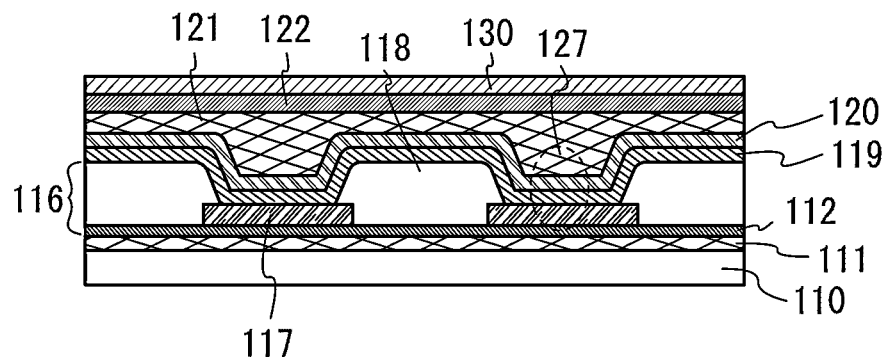

FIG. 1B illustrates an example of a passive matrix flexible light-emitting device. The flexible light-emitting device illustrated in FIG. 1B includes the plastic substrate 110, the first adhesive layer 111, the protective layer 112, the light-emitting element 127 (including the first electrode 117, the EL layer 119, and the second electrode 120), the partition wall 118, the second adhesive layer 121, the metal substrate 122, and the heat radiation material layer 130.

In FIG. 1B, the layer 116 to be separated includes the protective layer 112, the first electrode 117 of the light-emitting element, and the partition wall 118, which are partly illustrated. The light-emitting element 127 includes the first electrode 117 which is exposed from the partition wall 118, the EL layer 119 containing an organic compound which is formed so as to cover at least the first electrode 117, and the second electrode 120 which is provided in a stripe shape to cover the EL layer 119. The metal substrate 122 is bonded onto the second electrode 120 with use of the second adhesive layer 121. Further, the heat radiation material layer 130 is formed over the metal substrate 122. In FIG. 1B, the layer 116 to be separated includes at least the protective layer 112, the first electrode 117, and the partition wall 118, but this is just an example which can be easily formed and the components included in the layer 116 to be separated are not limited thereto. Although FIG. 1B illustrates an example of the passive matrix light-emitting device in which the partition wall 118 has a tapered shape, a passive matrix light-emitting device in which the partition wall 118 has an inversely tapered shape may also be used. In such a case, the EL layer 119 and the second electrode 120 can be separately provided because of the inversely tapered partition wall 118, so that patterning using a mask is not necessary in the formation of the EL layer 119 and the second electrode 120.

Since the flexible light-emitting device illustrated in FIG. 1B has the protective layer 112 and the metal substrate 122, it is possible to suppress moisture penetration from both a surface of the plastic substrate and a surface of the metal substrate, and thus a light-emitting device having a long lifetime can be realized. Further, the heat radiation material layer 130 formed over the metal substrate 122 makes it possible to suppress an increase in the surface temperature of the light-emitting device, thereby preventing the breakdown of the light-emitting device and a reduction in its reliability which are caused by heat generation.

The light-emitting device in this embodiment is manufactured as follows. The layer 116 to be separated including the protective layer 112 is formed over a formation substrate having high heat resistance such as a glass substrate or a ceramic substrate with a separation layer interposed therebetween, the formation substrate and the layer 116 to be separated are then separated along the separation layer, and the layer 116 to be separated which is separated is bonded onto the plastic substrate 110 using an adhesive. Thus, the protective layer 112 having sufficiently low water permeability is provided on the plastic substrate 110 side which has high water permeability. Therefore, the light-emitting device in this embodiment has the first adhesive layer 111 between the plastic substrate 110 and the protective layer 112.

The plastic substrate in this specification means a substrate having flexibility and a property of transmitting visible light. There is no particular limitation on the plastic substrate 110 as long as it has flexibility and a property of transmitting visible light, but it is preferable to use a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like. The plastic substrate is preferably made of a material having a low thermal expansion coefficient. Therefore, a polyamide imide resin, a polyimide resin, PET, or the like which has a thermal expansion coefficient of $30 \times 10^{-6}$/K or less can be suitably used. A substrate in which a glass fiber is impregnated with a resin or a substrate whose thermal expansion coefficient is reduced by mixing an organic resin with an inorganic filler can also be used.

In order to improve light extraction efficiency, the refractive index of the plastic substrate is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferred, because such a filler can maintain optical transparency.

Further, a surface of the plastic substrate which faces the air is preferably uneven. The unevenness of the surface of the plastic substrate which faces the air makes it possible to extract a component of the light from the light emitting element that is totally reflected and not able to be extracted to the air, and thus the light extraction efficiency can be improved.

Alternatively, the plastic substrate 110 may have a structure in which the above material is combined with an antifouling film, an uneven film capable of improving the light extraction efficiency, or the like.

The first adhesive layer 111 includes a material having a property of transmitting visible light. For example, any of a variety of curable adhesives, e.g., a light curable adhesive such as a UV curable adhesive, a reactive curable adhesive, a thermal curable adhesive, and an anaerobic adhesive can be used. As such an adhesive, an epoxy resin, an acrylic resin, a silicone resin, a phenol resin, or the like is used. For the first adhesive layer 111, a material having low moisture permeability is preferably used, and an epoxy resin can be suitably used in particular.

In order to increase the thermal conductance of the first adhesive layer 111, a material in which a thermally conductive filler is dispersed into a resin may be employed. The first adhesive layer 111 formed by dispersing a thermally conductive filler into a resin preferably has a thermal conductivity of 0.50 W/m·K or more, further preferably 1.0 W/m·K or more. As the thermally conductive filler, a material having a higher thermal conductivity than the above resin used for the first adhesive layer is used. In particular, a material having a thermal conductivity of 30 W/m·K or more is preferably used. Examples include aluminum which has a thermal conductivity of 260 W/m·K, aluminum nitride which has a thermal conductivity of 300 W/m·K, alumina which has a thermal conductivity of 36 W/m·K, boron nitride, silicon nitride, and the like. Another example of the thermally conductive filler is a metal particle of silver, copper having a thermal conductivity of 388 W/m·K, or the like. A filler functioning as a drying agent is preferably used as the thermally conductive filler because such a filler improves the moisture resistance of the first adhesive layer 111 in addition to the thermal conductivity. The thermally conductive filler and the filler functioning as a drying agent may be mixed and used. Zeolite is an example of the filler functioning as a drying agent. Note that the filler used for the first adhesive layer 111 preferably has a particle diameter greater than or equal to 1 nm and less than or equal to 1000 nm so as not to decrease bendability. If the particle diameter of the filler is large, a defect or a crack could start at the filler when the light-emitting device is bent.

The protective layer 112 includes a material having low water permeability and a property of transmitting visible light. For example, an insulating layer containing nitrogen and silicon, such as a silicon nitride layer, a silicon nitride oxide layer, or a silicon oxynitride layer, is preferably used. An aluminum oxide layer may also be used.

When the plastic substrate 110 having a high refractive index is used, it is preferable that each of the first adhesive layer 111 and the protective layer 112 also have a high refractive index. The refractive indexes preferably increase in the order of the plastic substrate 110, the first adhesive layer 111, the protective layer 112, and the first electrode 117. For example, indium tin oxide (ITO) and zinc oxide to which aluminum is added (AZO), which can be suitably used for the first electrode 117, each have a refractive index of 1.8 to 2.1. Thus each of the plastic substrate 110, the first adhesive layer 111, and the protection layer 112 preferably has a refractive index of 1.6 or more, further preferably greater than or equal to 1.6 and less than or equal to 1.8.

By having a structure in which an inorganic filler having a high refractive index is dispersed into an organic resin, for example, the first adhesive layer 111 can have a higher refractive index than an adhesive layer formed of only the organic resin. In particular, an inorganic filler having a particle diameter as small as 40 nm or less is preferred, because such a filler can maintain optical transparency. As the protective layer 112, a silicon nitride oxide layer having a property of transmitting visible light can be suitably used, for example.

A metal substrate is used as a substrate that faces the plastic substrate 110 with the light-emitting element 127 interposed therebetween. The metal substrate 122 has a thickness greater than or equal to 10 μm and less than or equal to 200 μm so as to be flexible. Note that a material having a thickness greater than or equal to 20 μm and less than or equal to 50 μm is preferably used so as not to decrease the bendability. A material included in the metal substrate 122 is not limited to a particular material, but it is preferable to use aluminum, copper, nickel, an alloy of metals such as an aluminum alloy or stainless steel, or the like. Note that, before the metal substrate 122 is bonded, water adhering to a surface of the metal substrate 122 is preferably removed by baking in a vacuum or plasma treatment.

The metal substrate 122 does not have a property of transmitting visible light due to its thickness in the above range, although it has sufficiently low water permeability and high flexibility. Thus, the light-emitting device in this embodiment is a so-called bottom emission light-emitting device from which light emission is extracted through the plastic substrate 110 provided with the transistors. Note that, like the plastic substrate 110, the metal substrate 122 is bonded to the light-emitting element 127 through adhesive layer interposed therebetween. Thus, the second adhesive layer 121 is provided between the metal substrate 122 and the second electrode 120 of the light-emitting element 127 or a film sealing layer 126.

As a material of the second adhesive layer 121, the same material as that of the first adhesive layer 111 can be used. For example, an adhesive such as a reactive curable adhesive, a thermal curable adhesive, or an anaerobic adhesive can be used. As a material of such an adhesive, an epoxy resin, an acrylic resin, a silicone resin, a phenol resin, or the like is used.

In order to increase the thermal conductance of the second adhesive layer 121, a material in which a thermally conductive filler is dispersed into a resin may be employed. The second adhesive layer 121 formed by dispersing a thermally conductive filler into a resin preferably has a thermal conductivity of 0.50 W/m·K or more, further preferably 1.0 W/m·K or more. As the thermally conductive filler, a material having a higher thermal conductivity than the above resin used for the second adhesive layer is used. In particular, a material having a thermal conductivity of 30 W/m·K or more is preferably used. Examples include aluminum which has a thermal conductivity of 260 W/m·K, aluminum nitride which has a thermal conductivity of 300 W/m·K, alumina which has a thermal conductivity of 36 W/m·K, boron nitride, silicon nitride, and the like. Another example of the thermally conductive filler is a metal particle of silver, copper having a thermal conductivity of 388 W/m·K, or the like. A filler functioning as a drying agent is preferably used as the thermally conductive filler because such a filler improves the moisture resistance of the second adhesive layer 121 in addition to the thermal conductivity. The thermally conductive filler and the filler functioning as a drying agent may be mixed and used. Zeolite is an example of the filler functioning as a drying agent. Note that the filler used for the second adhesive layer 121 preferably has a particle diameter of greater than or equal to 1 nm and less than or equal to 1000 nm so as not to decrease bendability. If the particle diameter of the filler is large, a defect or a crack could start at the filler when the light-emitting device is bent.

The heat radiation material layer 130 is formed using a material having a higher thermal emissivity than the material used for the metal substrate 122. Although thermal emissivity depends on the thickness of a material, the material used for the metal substrate 122 has a low thermal emissivity in many cases: for example, the thermal emissivities of stainless steel and aluminum are merely 0.12 and 0.04 respectively. The heat radiation material layer 130 is formed using a material having a thermal emissivity of 0.80 or more, further preferably a material having a thermal emissivity of 0.90 or more. As a material having such a high thermal emissivity, Cerac a (a registered trademark of Ceramission Co., Ltd.), which has a thermal emissivity of 0.96, can be suitably used.

As a material having a high thermal emissivity, a metal oxide such as titanium oxide, iron oxide, aluminum oxide or copper oxide, or a ceramic material may be used. For example, the heat radiation material layer 130 may be formed in such a manner that aluminum is used for the metal substrate 122 and anodizing treatment is performed on a surface of the metal substrate 122 to form an aluminum oxide film. The heat radiation material layer 130 preferably has an uneven surface when the heat radiation material layer 130 includes a metal oxide, because the uneven surface increases the surface area of the heat radiation material layer 130 to enhance its heat radiation property.

In the flexible light-emitting device having such a structure according to this embodiment, the protective layer having sufficiently low water permeability which is formed at a temperature greater than or equal to the upper temperature limit of the plastic substrate is provided on the plastic substrate side which has high water permeability, whereby the influence of moisture which penetrates through the plastic substrate can be effectively reduced. In addition, since the metal substrate having sufficient flexibility and low water permeability is used as a sealing substrate which faces the plastic substrate with the light-emitting element interposed therebetween, the influence of moisture which penetrates through the sealing substrate can also be effectively suppressed. In this manner, on both sides of the light-emitting element, it is possible to effectively reduce moisture which penetrates, without stacking a large number of layers. Further, the heat radiation material layer provided over the metal substrate makes it possible to suppress an increase in the surface temperature of the light-emitting device, thereby preventing the breakdown of the light-emitting device and a reduction in its reliability which are caused by heat generation. Thus, the flexible light-emitting device in this embodiment can be said to be a flexible light-emitting device having a long lifetime which is easy to fabricate.

In the layer to be separated which is formed over the formation substrate, a transistor, a light-emitting element, and the like may be formed in advance besides the protective layer. As the transistor, it is naturally possible to use a transistor that can be manufactured without a high-temperature process, such as a transistor using amorphous silicon or a transistor using an oxide semiconductor. It is also possible to employ a transistor using a crystalline semiconductor layer that requires a certain degree of heating or laser processing, such as crystalline silicon, because the transistor can be formed over the formation substrate having high heat resistance. In addition, since a transistor using a crystalline semiconductor can be used, the driver circuit portion or a CPU can be formed over the same substrate over which the pixel portion is formed. Accordingly, it is also possible to fabricate a flexible light-emitting device having great advantages in cost and manufacturing process over one that has a driver circuit portion or a CPU provided separately.

Figure 1C:
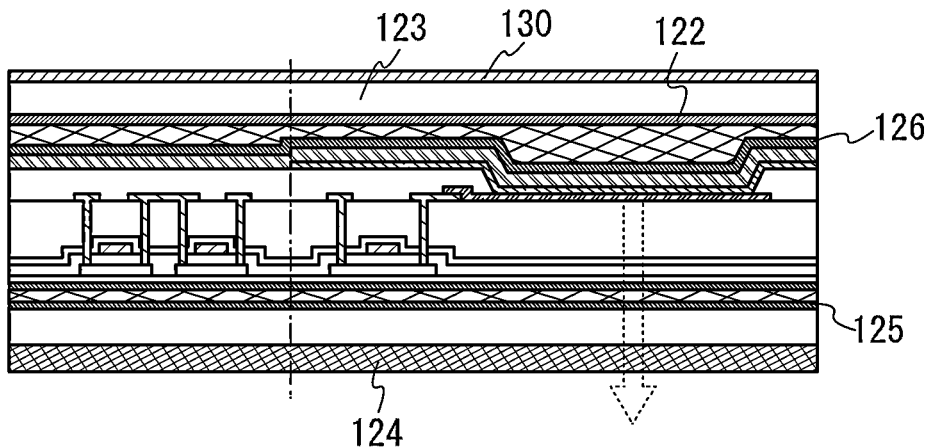

Further, as in a flexible light-emitting device illustrated in FIG. 1C, a resin layer 123 may be provided between the metal substrate 122 and the heat radiation material layer 130. The provision of the resin layer 123 can disperse pressure exerted on the metal substrate 122, thereby protecting the metal substrate 122. The resin layer 123 can be formed using one or more of thermal curable resin materials such as an epoxy resin, an acrylic resin, a silicone resin, a phenol resin, and a polyester resin, or one or more of thermoplastic resin materials such as polypropylene, polyethylene, polycarbonate, polystyrene, polyamide, polyetherketone, a fluorine resin, and polyethylenenaphthalate.

The resin layer 123 may further include a fibrous body. When a thin metal foil having a thickness of 20 μm or less is used for the metal substrate 122, the metal substrate 122 is broken (buckles) easily. In order to prevent buckling as well as to keep bendability, for example, the resin layer 123 including a fibrous body may be provided by forming a material including a glass fiber filled with a resin. By providing the resin layer 123 including a fibrous body, a flexible light-emitting device highly resistant to bending and breaking can be fabricated. As the fibrous body, a glass fiber is preferable, for example. To form the resin layer 123 including a fibrous body, there is a method in which a glass fiber filled with a resin is bonded using an adhesive, or a method in which a glass fiber is filled with an adhesive and this semi-cured resin layer is placed over the metal substrate 122 and then is cured, for example. It is preferable that a material in which a heat radiation material layer is stacked over a fibrous body be bonded over the metal substrate 122 with a viscous adhesive layer interposed therebetween, because such a structure enables formation of the resin layer 123 including the fibrous body and the heat radiation material layer 130 at one time. As an example of the material in which a heat radiation material layer is stacked over a fibrous body and which is to be bonded over the metal substrate 122, "MAZUHARUICHIBAN Soft type" (produced by Oki Electric Industry Co., Ltd., "MAZUHARUICHIBAN" is a registered trademark of Ceramission Co., Ltd.) can be given.

Further, as illustrated in FIG. 1C, a coat layer 124 may be provided on a surface of the plastic substrate 110 which is opposite to the surface of the plastic substrate 110 which is provided with the light-emitting element and the like. The coat layer 124 can be formed with any of a variety of materials such as an organic film, an inorganic film, and a stacked film including an organic film and an inorganic film. The coat layer 124 means a hard coat layer (such as a silicon nitride layer) capable of protecting the surface of the plastic substrate 110 which is soft from scratches or the like, or a layer (such as an aramid resin layer) which can disperse pressure.

A conductive film having a property of transmitting visible light is further preferably used as the coat layer 124, because such a film can prevent charging on the plastic substrate 110. Examples of a material of the conductive film having a property of transmitting visible light which is used for the coat layer 124 include indium oxide, tin oxide, ITO, indium oxide containing tungsten oxide, indium zinc oxide containing tungsten oxide, indium oxide containing titanium oxide, indium zinc oxide, indium tin oxide to which silicon oxide is added, antimony oxide, and the like. The coat layer 124 can be formed by a sputtering method, a printing method, a vacuum evaporation method, or the like.

A transistor or a pixel portion can be protected with the use of the coat layer 124 including a conductive film having a property of transmitting visible light, even if a human hand or finger charged with static electricity touches the plastic substrate 110 and discharges the static electricity.

Further, the coat layer 124 can function as a protective layer suppressing moisture penetration when it is provided so as to cover side surfaces of the plastic substrate 110.

Further, a substrate that is provided with a waterproof layer 125 in advance may be used as the plastic substrate 110 or the film sealing layer 126 may be provided over the second electrode 120 so that moisture penetration is further suppressed. In the flexible light-emitting device in FIG. 1C, since the protective layer 112 and the metal substrate 122 effectively suppress moisture that penetrates through the surfaces of the substrates, the waterproof layer 125 or the film sealing layer 126 is effective in further reducing water permeability supplementarily. Each of the waterproof layer 125 and the film sealing layer 126 is preferably formed using a material having low water permeability, and can be formed using a layer containing nitrogen and silicon, such as a silicon nitride layer or a silicon nitride oxide layer. Alternatively, a layer containing nitrogen and aluminum or an aluminum oxide layer may be used.

Note that any one of the resin layer 123, the coat layer 124, the waterproof layer 125, and the film sealing layer 126 may be employed, or more than one or all of them may be employed. FIG. 1C illustrates an example of the structure in which the flexible light-emitting device in FIG. 1A includes the resin layer 123, the coat layer 124, the waterproof layer 125, and the film sealing layer 126. Such a structure may also be applied to the flexible light-emitting device in FIG. 1B.

In each of FIGS. 1A to 1C, only one light-emitting element 127 is illustrated; however, in the case where the flexible light-emitting device in this embodiment is used on purpose to display images, a pixel portion including a plurality of light-emitting elements 127 is formed. When a full-color image is displayed, it is necessary to obtain light of at least three colors, i.e., red, green, and blue. The following are given as methods therefor: a method in which a necessary portion of each EL layer 119 is formed of an appropriate material for each color, a method in which all the light-emitting elements are formed to emit white light and the light is transmitted through a color filter layer so that each color is obtained, a method in which all the light-emitting elements are formed to emit light of blue or the color that has a shorter wavelength than blue so that each color is obtained through a color conversion layer, and the like.

FIGS. 2A to 2D each illustrate a method of providing a color filter layer (or a color conversion layer) according to this embodiment. A flexible light-emitting device illustrated in each of FIGS. 2A to 2D has a color filter layer (or a color conversion layer) 300 and a barrier layer 301. The barrier layer 301 is placed so as to protect a light-emitting element or a transistor from influence of a gas generated from the color filter layer (or the color conversion layer) 300, but is not necessarily provided. The color filter layer (or the color conversion layer) 300 is provided corresponding to each of the colors for the light-emitting elements 127. And the adjacent color filter layers may be overlapped at a portion other than an open region (a portion where the first electrode, the EL layer, and the second electrode are directly overlapped) of the light-emitting element 127. The color filter layer (or the color conversion layer) 300 and the barrier layer 301 may be formed only in the pixel portion or may be formed also in the driver circuit portion.

Figure 2A:
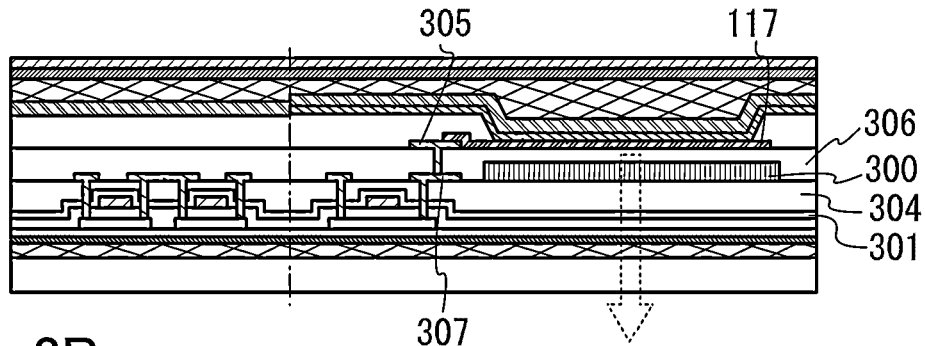
FIGS. 2A to 2D each illustrate a light-emitting device according to one embodiment.

In FIG. 2A, after an electrode 307 of a transistor is formed, the color filter layer 300 is formed over an interlayer insulating layer 304 of the transistor, and a planarization layer 306 is formed to include an organic insulating film so as to planarize a step made by the color filter layer. After that, a contact hole is formed in the planarization layer 306, an electrode 305 for connecting the first electrode 117 of the light-emitting element and the electrode 307 of the transistor is formed, and the first electrode 117 of the light-emitting element is provided, as shown as an example. The barrier layer 301 may be provided over the planarization layer 306.

Figure 2B:
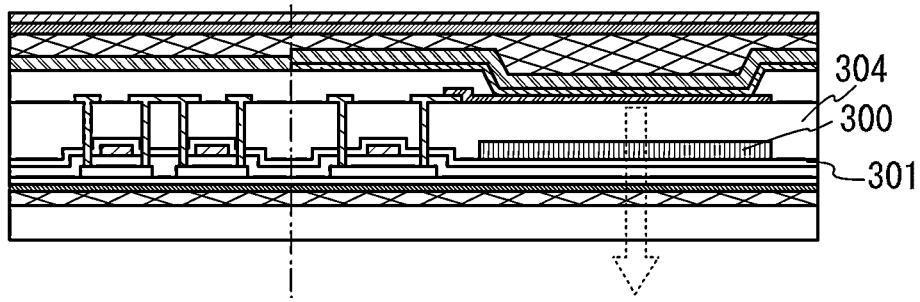

In addition, as illustrated in FIG. 2B, the color filter layer 300 may be provided under the interlayer insulating layer 304. In FIG. 2B, after the barrier layer 301 is formed, the color filter layer 300 is formed over the barrier layer 301. After that, the interlayer insulating layer 304 and the electrode 305 of the transistor are formed, and the first electrode 117 of the light-emitting element is provided, as shown as an example.

Although FIGS. 2A to 2D each illustrate only a color filter layer (or a color conversion layer) of a single color, color filter layers (or color conversion layers) of red, blue, and green are formed at appropriate positions with appropriate shapes in a light-emitting device. Although stripe arrangement, diagonal mosaic arrangement, triangle mosaic arrangement, and the like are possible patterns, any one may be employed for the arrangement of the color filter layers (or the color conversion layers). Alternatively, in the case of using a light-emitting element that emits white light and color filter layers, RGBW four pixel arrangement may be used. The RGBW four pixel arrangement is the arrangement of pixels including a pixel that is not provided with a color filter layer and pixels provided with color filter layers which transmit red light, blue light, and green light respectively. This arrangement has an effect on a power consumption reduction and the like. White light emitted from the light-emitting element includes, for example, red light, green light, and blue light, and these colors of light are each preferably defined by the National Television Standards Committee (NTSC).

The color filter layer can be formed using a known material. In the case of using a photosensitive resin, the pattern for the color filter layer may be formed by exposure of the color filter layer itself to light and development of it, but preferably is formed by dry etching since the pattern is fine.

Figure 2C:
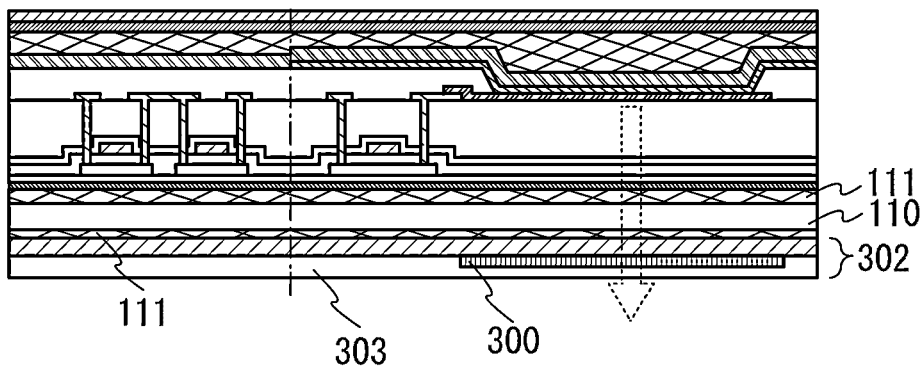

FIG. 2C illustrates an example of a structure having a color filter substrate 302 provided with the color filter layer 300. In the case where the surface of the color filter substrate 302, which is not provided with the color filter layer 300, is bonded to the plastic substrate 110 with use of the first adhesive layer 111, the color filter substrate 302 may be provided with a coat layer 303 for protecting the color filter layer 300 from scratches and the like. The coat layer 303 includes a material having a property of transmitting visible light, and can be formed using the same material as the coat layer 124. In addition, although not illustrated, the surface of the color filter substrate 302, which is provided with the color filter layer 300, may be bonded to face the plastic substrate 110. Note that the color filter substrate 302 is a substrate obtained by forming the color filter layer 300 on any of a variety of substrates having flexibility and a property of transmitting visible light, for example, a substrate including the same material as the plastic substrate 110.

Figure 2D:
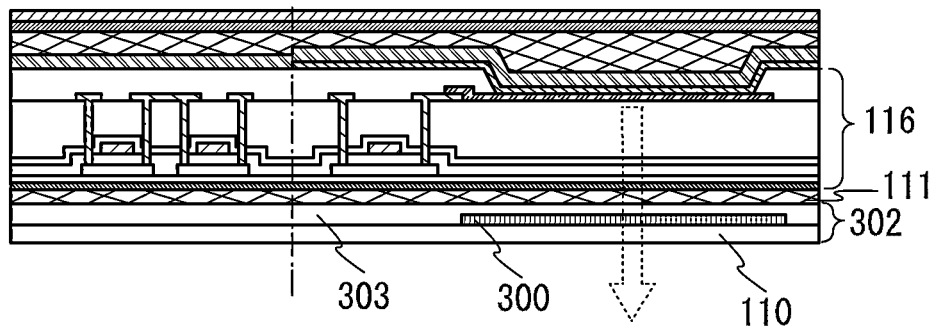

FIG. 2D illustrates an example of a structure in which the color filter substrate 302 fabricated by providing, in advance, the color filter layer 300 for the plastic substrate 110 is directly bonded to the layer 116 to be separated which has the first electrode. The color filter substrate 302 in FIG. 2D is provided with a coat layer 303 covering the color filter layer 300. The color filter substrate 302 including the plastic substrate 110 provided with the color filter layer 300 is directly bonded to the layer 116 to be separated which has the first electrode, whereby the number of components and the manufacturing cost can be reduced. The color filter layer (or the color conversion layer) is provided as briefly described above. In addition to the above, a black matrix may be provided between light-emitting elements, or other known structures may be employed.

Next, as an example, a method of manufacturing a flexible light-emitting device including a transistor according to this embodiment will be described with reference to FIGS. 3A to 3E and FIGS. 1A and 1C.

Figure 3A:
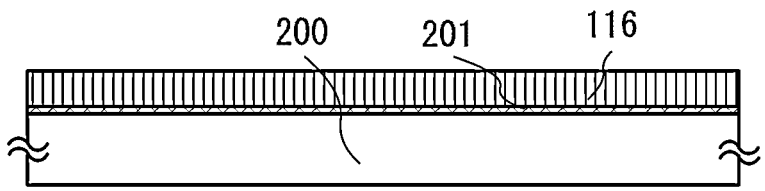
FIGS. 3A to 3E illustrate a process of manufacturing a light-emitting device according to one embodiment.
Figure 3B:
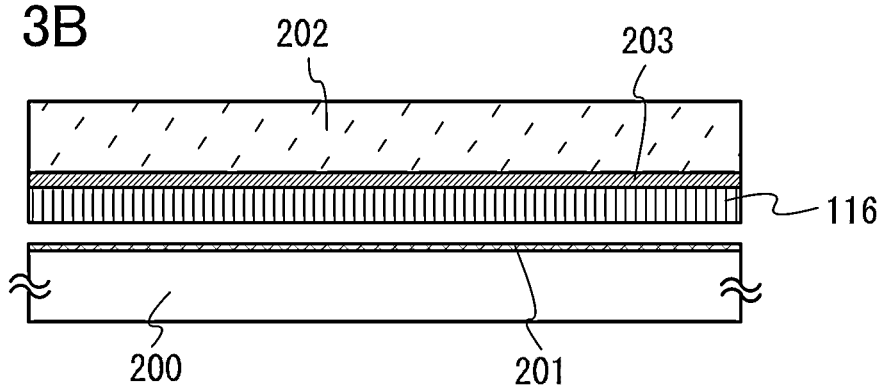

First, the layer 116 to be separated including the transistor, the first electrode 117, and the like is formed over a formation substrate 200 having an insulating surface, with a separation layer 201 interposed therebetween (see FIG. 3A).

As the formation substrate 200, it is possible to use a substrate having heat resistance which is sufficiently high to the extent that a high-quality protective layer can be formed, such as a glass substrate, a quartz substrate, a sapphire substrate, a ceramic substrate, or a metal substrate having a surface provided with an insulating layer.

Since a substrate with low flexibility which can be used for manufacture of normal displays is used as the formation substrate, a transistor for a pixel portion for high-definition display can be provided.

The separation layer 201 is formed by a sputtering method, a plasma CVD method, a coating method, a printing method, or the like as a single layer or a stack of layers including an element selected from tungsten, molybdenum, titanium, tantalum, niobium, nickel, cobalt, zirconium, zinc, ruthenium, rhodium, palladium, osmium, iridium, and silicon; an alloy material containing the element as its main component; or a compound material containing the element as its main component. The crystalline structure of a layer containing silicon may be any of amorphous, microcrystalline, and polycrystalline. Note that the coating method here includes a spin coating method, a droplet discharge method, a dispensing method, a nozzle-printing method, and a slot die coating method.

When the separation layer 201 has a single layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 201 has a stacked layer structure, it is preferable that a tungsten layer, a molybdenum layer, or a layer containing a mixture of tungsten and molybdenum be formed as a first layer and that an oxide, a nitride, an oxynitride, or a nitride oxide of tungsten, molybdenum, or a mixture of tungsten and molybdenum be formed as a second layer.

In the case where the separation layer 201 has a stacked layer structure of a layer containing tungsten and a layer containing an oxide of tungsten, the following manner may be employed: the layer containing tungsten is formed, and an insulating layer including an oxide is formed over the layer containing tungsten, whereby the layer containing an oxide of tungsten is formed at the interface between the tungsten layer and the insulating layer. This also applies to the case where a layer containing a nitride, an oxynitride, or a nitride oxide of tungsten is formed: after a layer containing tungsten is formed, a silicon nitride layer, a silicon oxynitride layer, or a silicon nitride oxide layer is formed thereover. Further, a surface of the layer containing tungsten may be subjected to thermal oxidation treatment, oxygen plasma treatment, or treatment using a strong oxidizing solution such as ozone water to form the layer containing an oxide of tungsten. Furthermore, plasma treatment or heat treatment may be performed in an oxygen gas, a nitrogen gas, a dinitrogen monoxide gas, or an atmosphere of a mixture of any of these gases and another gas.

As the layer 116 to be separated, first, the protective layer 112 is formed over the separation layer 201. An insulating layer containing nitrogen and silicon such as silicon nitride, silicon oxynitride, or silicon nitride oxide is formed by plasma CVD under conditions where the temperature is in the range of 250° C. to 400° C. and the others are known conditions, whereby the protective layer 112 can be a layer that is dense and has very low water permeability.

Then, the base insulating layer 113 is formed in order to stabilize properties of the transistor which is to be formed later. The base insulating layer 113 can be formed as a single layer or more than one layer using an inorganic insulating layer of silicon oxide, silicon nitride, silicon oxynitride, silicon nitride oxide, or the like. When the protective layer 112 can also serve as an insulating layer that is a base, the base insulating layer 113 is not necessarily formed.

A material forming a semiconductor layer included in the transistor can be any of the following materials: an amorphous semiconductor (hereinafter also referred to as "AS") manufactured by a vapor-phase growth method using a semiconductor source gas typified by silane or germane or a sputtering method; a polycrystalline semiconductor formed by crystallizing the amorphous semiconductor with the use of light energy or thermal energy; a microcrystalline (also referred to as semi-amorphous or microcrystal) semiconductor (hereinafter also referred to as "SAS"); a semiconductor containing an organic material as its main component; and the like. The semiconductor layer can be formed by a sputtering method, an LPCVD method, a plasma CVD method, or the like.

Considering Gibbs free energy, a microcrystalline semiconductor is in a metastable state which is intermediate between an amorphous state and a single crystal state. That is, the microcrystalline semiconductor is in a third state which is stable in free energy, and has short-range order and lattice distortion. Columnar or needle-like crystals grow in the direction of the normal to the surface of the substrate. The Raman spectrum of microcrystalline silicon, which is a typical example of a microcrystalline semiconductor, is shifted to a lower wavenumber side than 520 $cm^{-1}$ which represents single crystal silicon. In other words, the Raman spectrum of microcrystalline silicon has a peak between 480 $cm^{-1}$ which represents amorphous silicon and 520 $cm^{-1}$ which represents single crystal silicon. Furthermore, the microcrystalline semiconductor layer contains 1 atomic % or more of hydrogen or halogen to terminate dangling bonds. When the microcrystalline semiconductor layer further contains a rare gas element such as helium, argon, krypton, or neon to further promote lattice distortion, a favorable microcrystalline semiconductor layer with improved stability can be obtained.

This microcrystalline semiconductor layer can be formed by a high-frequency plasma CVD method with a frequency of several tens of megahertz to several hundreds of megahertz, or a microwave plasma CVD method with a frequency of 1 GHz or more. For example, the microcrystalline semiconductor layer can be formed using $SiH_4$, $Si_2H_6$, $SiH_2Cl_2$, $SiHCl_3$, $SiCl_4$, $SiF_4$, or the like which is diluted with hydrogen. The flow rate ratio of hydrogen to such a compound is set to greater than or equal to 5:1 and less than or equal to 200:1, preferably greater than or equal to 50:1 and less than or equal to 150:1, more preferably 100:1. The microcrystalline semiconductor layer can be formed by dilution with one or more kinds of rare gas elements selected from helium, argon, krypton, and neon in addition to hydrogen.

As an example of an amorphous semiconductor, hydrogenated amorphous silicon can be given, and as an example of a crystalline semiconductor, polysilicon or the like can be given. Examples of polysilicon (polycrystalline silicon) include so-called high-temperature polysilicon which contains polysilicon formed at a process temperature of 800° C. or more as the main component, so-called low-temperature polysilicon which contains polysilicon formed at a process temperature of 600° C. or less as the main component, polysilicon obtained by crystallizing amorphous silicon by using an element that promotes crystallization or the like, and the like. It is needless to say that as mentioned above, a microcrystalline semiconductor or a semiconductor partly containing a crystal phase can be used.

As a material of the semiconductor layer, as well as an element such as silicon or germanium, a compound semiconductor such as GaAs, InP, SiC, ZnSe, GaN, or SiGe can be used. An oxide semiconductor such as zinc oxide, tin oxide, magnesium zinc oxide, gallium oxide, or indium oxide, an oxide semiconductor including more than one of the above oxide semiconductors, or the like can also be used. For example, an oxide semiconductor including zinc oxide, indium oxide, and gallium oxide can also be used. In the case of using zinc oxide for the semiconductor layer, it is preferable that the gate insulating layer be formed of $Y_2O_3$, $Al_2O_3$, or $TiO_2$, a stacked layer thereof, or the like and that the gate electrode layer, the source electrode layer, and the drain electrode layer be each formed of ITO, aluminum, titanium, tungsten, or the like. In addition, indium, gallium, or the like can be added to the zinc oxide. Note that a transparent transistor using an oxide semiconductor layer having a property of transmitting visible light can also be used as a transistor for a pixel portion. When such a transparent transistor is formed so as to overlap with a light-emitting element, the area ratio of a light-emitting element in a pixel, i.e., a so-called aperture ratio can be increased, whereby a flexible display device with high luminance and high resolution can be formed. Further, when a gate electrode, a source electrode, and a drain electrode of the transparent transistor are each formed using a conductive layer having a property of transmitting visible light, the aperture ratio can be further enhanced.

In the case of using a crystalline semiconductor layer as the semiconductor layer, the crystalline semiconductor layer is formed by any of various methods (such as a laser crystallization method, a thermal crystallization method, or a thermal crystallization method using an element promoting crystallization, such as nickel). A microcrystalline semiconductor which is an SAS can be crystallized by laser irradiation to increase crystallinity. In the case where an element that promotes crystallization is not introduced, before being irradiated with laser light, an amorphous silicon film is heated at 500° C. for one hour in a nitrogen atmosphere, whereby hydrogen contained in the amorphous silicon film is released to a concentration of $1 \times 10^{20}$ atoms/cm$^3$ or less. This is because, if the amorphous silicon film contains much hydrogen, the amorphous semiconductor film is broken by laser irradiation.

There is no particular limitation on a method for introducing a metal element into the amorphous semiconductor layer as long as the metal element can exist on the surface of or inside the amorphous semiconductor layer. For example, a sputtering method, a CVD method, a plasma processing method (including a plasma CVD method), an adsorption method, or a method in which a metal salt solution is applied can be employed. Among them, the method using a solution is simple and easy, and is useful in terms of easy concentration adjustment of the metal element. At this time, an oxide film is preferably formed by UV light irradiation in an oxygen atmosphere, thermal oxidation, treatment with ozone water or hydrogen peroxide including a hydroxyl radical, or the like in order to improve the wettability of a surface of the amorphous semiconductor layer and to spread an aqueous solution on the entire surface of the amorphous semiconductor layer.

In addition, in a crystallization step in which the amorphous semiconductor layer is crystallized to form a crystalline semiconductor layer, the crystallization may be performed by adding an element which promotes crystallization (also referred to as a catalyst element or a metal element) to the amorphous semiconductor layer and performing heat treatment (at 550° C. to 750° C. for 3 minutes to 24 hours). As the element which promotes (accelerates) the crystallization, one or more selected from iron, nickel, cobalt, ruthenium, rhodium, palladium, osmium, iridium, platinum, copper, and gold can be used.

In order to remove or reduce the element which promotes crystallization from the crystalline semiconductor layer, a semiconductor layer containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used. For example, one or more selected from phosphorus, nitrogen, arsenic, antimony, bismuth, boron, helium, neon, argon, krypton, and xenon can be used. The semiconductor layer containing a rare gas element is formed over the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and thus the element which promotes crystallization in the crystalline semiconductor layer is removed or reduced. Then, the semiconductor layer containing a rare gas element, which serves as a gettering sink, is removed.

The amorphous semiconductor layer may be crystallized by using combination of heat treatment and laser light irradiation. The either heat treatment or the laser light irradiation may be carried out more than once.

The crystalline semiconductor layer may be directly formed over the base insulating layer over the formation substrate by a plasma method. The crystalline semiconductor layer is not necessarily formed over the entire surface of the base insulating layer, and can be formed selectively.

As the semiconductor layer containing an organic material as its main component, it is possible to use a known organic semiconductor layer, and pentacene, tetracene, a thiophene oligomer derivative, a phenylene derivative, a phthalocyanine compound, a polyacetylene derivative, a polythiophene derivative, a cyanine dye, and the like can be given as examples.

The gate insulating layer and the gate electrode are each formed to have a known structure by a known method. For example, the gate insulating layer has a known structure such as a single layer structure of silicon oxide or a stacked layer structure of silicon oxide and silicon nitride. The gate electrode is, for example, formed by a CVD method, a sputtering method, a droplet discharge method, or the like to include any of silver, gold, copper, nickel, platinum, palladium, iridium, rhodium, tungsten, aluminum, tantalum, molybdenum, cadmium, zinc, iron, titanium, silicon, germanium, zirconium, and barium; or an alloy material or a compound material containing any of the elements as its main component. A semiconductor layer typified by a polycrystalline silicon layer doped with an impurity element such as phosphorus or an Ag—Pd—Cu alloy may be used. Further, either a single layer structure or a structure of more than one layer may be employed.

Note that although FIGS. 1A and 1C each illustrate an example of a top gate transistor, it is needless to say that a bottom gate transistor or a transistor with another known structure may be used.

Next, the interlayer insulating layer is formed. The interlayer insulating layer can be formed using an inorganic insulating material or an organic insulating material as a single layer or a stack of layers. As the organic insulating material, for example, acrylic, polyimide, polyamide, polyimide amide, benzocyclobutene, or the like can be used. Although the two interlayer insulating layers 128 and 129 are illustrated in each of FIGS. 1A and 1C, this is just an example, and the structure of the interlayer insulating layer is not limited thereto.

The interlayer insulating layer which has been formed is patterned and etched, and a contact hole that reaches the semiconductor layer of the transistor is formed in the interlayer insulating layer, the gate insulating layer, and the like. Then, a conductive metal film is deposited by a sputtering method or a vacuum evaporation method and etched to form an electrode and a wiring of the transistor. A drain electrode of the transistor for a pixel portion is formed so as to partly overlap with the first electrode which is a pixel electrode, thereby obtaining electrical connection.

Then, the first electrode 117 is formed using a conductive film having a property of transmitting visible light. When the first electrode 117 is an anode, the conductive film having a property of transmitting visible light can be formed using indium oxide ($In_2O_3$), ITO, or the like as a material by a sputtering method, a vacuum evaporation method, or the like. An alloy of indium oxide and zinc oxide ($In_2O_3$—ZnO) may be used. Zinc oxide is also a suitable material, and zinc oxide to which gallium is added (ZnO:Ga) to increase the conductivity and the property of transmitting visible light, or the like can be used. When the first electrode 117 is a cathode, an extremely thin film of a material with a low work function such as aluminum can be used. Alternatively, a stacked layer structure which has a thin layer of such a substance and the above-mentioned conductive film having a property of transmitting visible light can be employed.

A material having a refractive index close to that of an organic EL material, such as AZO, is preferably used to form the first electrode 117 because such a material improves the light extraction efficiency.

Then, an insulating layer is formed using an organic insulating material or an inorganic insulating material so as to cover the interlayer insulating layer and the first electrode 117. The insulating layer is processed such that a surface of the first electrode 117 is exposed and the insulating layer covers an end portion of the first electrode 117, whereby the partition wall 118 is formed.

Through the above process, the layer 116 to be separated can be formed.

Next, the layer 116 to be separated and a temporary supporting substrate 202 are bonded using an adhesive 203 for separation, which is followed by separation of the layer 116 to be separated from the formation substrate 200 by using the separation layer 201. By this process, the layer 116 to be separated is placed on the temporary supporting substrate 202 side (see FIG. 3B).

As the temporary supporting substrate 202, a glass substrate, a quartz substrate, a sapphire substrate, a ceramic substrate, a metal substrate, or the like can be used. Alternatively, a plastic substrate which has heat resistance high enough to resist a temperature of the manufacturing process of this embodiment, or a flexible substrate such as a film may be used.

As the adhesive 203 for separation used here, an adhesive that is soluble in water or a solvent, an adhesive that is capable of being plasticized upon irradiation of UV light, or the like is used such that the temporary supporting substrate 202 and the layer 116 to be separated can be chemically or physically separated when necessary.

Any of various methods can be used as the process for transferring the layer to be separated to the temporary supporting substrate, as appropriate. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Further alternatively, a method carried out as follows may be employed: a film containing nitrogen, oxygen, hydrogen, or the like (e.g., an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as gas, thereby promoting separation between the layer to be separated and the formation substrate.

Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

By combining more than one of the above separation methods, the transfer process can be conducted more easily. Specifically, separation can also be conducted with physical force (by a machine or the like) after making it easier for the separation layer and the layer to be separated from each other by laser irradiation, etching of the separation layer with a gas, a solution, or the like and/or mechanical separation using a keen knife or the like.

Separation of the layer to be separated from the formation substrate may be carried out by soaking the interface between the separation layer and the layer to be separated in a liquid. The separation may also be performed while pouring a liquid such as water during the separation.

As another separation method, when the separation layer 201 is formed with tungsten, the separation may be performed while the separation layer 201 is etched with the use of a mixed solution of ammonia water and a hydrogen peroxide solution.

Figure 3C:
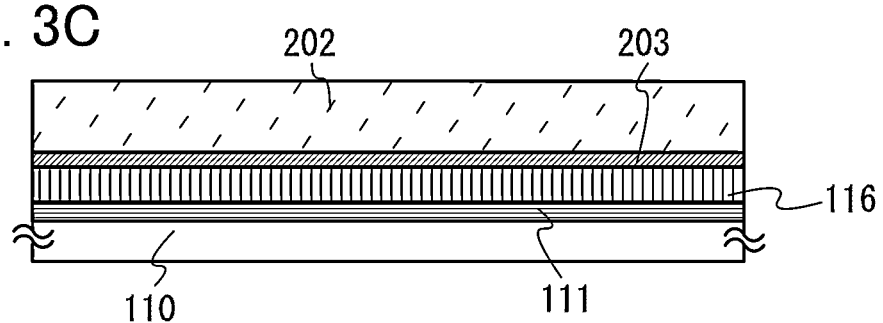
Figure 3D:
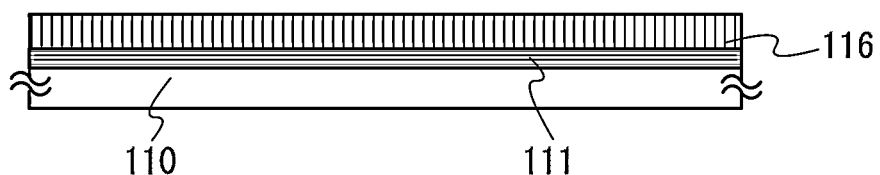

Next, the layer 116 to be separated, which is separated from the formation substrate 200 to expose the separation layer 201 or the protective layer 112 is bonded to the plastic substrate 110 with use of the first adhesive layer 111 including an adhesive different from the adhesive 203 for separation (see FIG. 3C).

The materials for the plastic substrate 110 and the first adhesive layer 111 are as given above. The plastic substrate 110 may be provided with the waterproof layer 125 in advance.

After that, the temporary supporting substrate 202 is removed by dissolving or plasticizing the adhesive 203 for separation. After the temporary supporting substrate 202 is removed, the adhesive 203 for separation is removed using water, a solvent, or the like so as to expose the first electrode 117 of the light-emitting element (see FIG. 3D).

Through the above-mentioned process, the layer 116 to be separated, which includes components such as the transistor and the first electrode 117 of the light-emitting element, can be manufactured over the plastic substrate 110.

After the first electrode 117 is exposed, the EL layer 119 containing an organic compound having a light-emitting property is formed. There is no particular limitation on a stacked layer structure of the EL layer 119. A layer containing a substance having a high electron-transport property, a layer containing a substance having a high hole-transport property, a layer containing a substance having a high electron-injection property, a layer containing a substance having a high hole-injection property, a layer containing a bipolar substance (a substrate having a high electron-transport property and a high hole-transport property), or the like are appropriately combined. For example, an appropriate combination of any of a hole-injection layer, a hole-transport layer, a light-emitting layer, an electron-transport layer, an electron-injection layer, and the like can be formed.

In this embodiment, a structure in which the EL layer has a hole-injection layer, a hole-transport layer, a light-emitting layer, and an electron-transport layer is explained. Material forming the layers are given below.

The hole-injection layer is a layer that is provided in contact with an anode and contains a substance having a high hole-injection property. Molybdenum oxide, vanadium oxide, ruthenium oxide, tungsten oxide, manganese oxide, or the like can be used. Alternatively, any of the following materials can be used to form the hole-injection layer: a phthalocyanine compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N-bis[4-[bis(3-methylphenyl)amino]phenyl]-N,N-diphenyl-[1,1'-biphenyl]-4,4'-diamine (abbreviation: DNTPD); a high-molecular compound such as poly(3,4-ethylenedioxythiophene)/poly(styrenesulfonic acid) (abbreviation: PEDOT/PSS); and the like.

For the hole-injection layer, a composite material containing a substance having a high hole-transport property and an acceptor substance can be used. Note that, by using the composite material containing the substance having a high hole-transport property and the acceptor substance, a material forming an electrode can be selected regardless of its work function. In other words, other than a material with a high work function, a material with a low work function can also be used for the first electrode 117. As the acceptor substance, 7,7,8,8-tetracyano-2,3,5,6-tetrafluoroquinodimethane (abbreviation: $F_4$-TCNQ), chloranil, and the like can be given. In addition, transition metal oxides can be given. Furthermore, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because their high electron-accepting properties are high. Among these metal oxides, molybdenum oxide is preferable since it can be easily treated due to its stability in the air and low hygroscopic property.

As the substance having a high hole-transport property used for the composite material, any of various compounds such as an aromatic amine compound, a carbazole derivative, aromatic hydrocarbon, an oligomer, a dendrimer, and a polymer can be used. Note that the organic compound used for the composite material is preferably an organic compound having a high hole-transport property. Specifically, a substance having a hole mobility of $10^{-6}$ cm$^2$/Vs or more is preferably used. Note that other than these substances, any substance that has a property of transporting more holes than electrons may be used. The organic compounds that can be used for the composite material are specifically given below.

Examples of the aromatic amine compounds include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

In addition, another examples of the carbazole derivatives that can be used for the composite material include 4,4'-di(N-carbazolyl)biphenyl (abbreviation: CBP), 1,3,5-tris[4-(N-carbazolyl)-phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Further, examples of the aromatic hydrocarbon that can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other than these examples, pentacene, coronene, or the like can be used. Thus, use of an aromatic hydrocarbon which has a hole mobility of $1\times10^{-6}$ cm$^2$/Vs or more and has 14 to 42 carbon atoms is more preferable.

The aromatic hydrocarbon that can be used for the composite material may have a vinyl skeleton. As an aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), or the like can be given.

Alternatively, a high-molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacryla mide] (abbreviation: PTPDMA), or poly[N,N'-bis(4-butylphenyl)-N,N'-bis(phenyl)benzidine] (abbreviation: Poly-TPD) can be used for the composite material.

The hole-transport layer is a layer that contains a substance having a high hole-transport property. Examples of the substance having a high hole-transport property which can be used include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB), and the like. The substances described here are mainly substances having a hole mobility of $10^{-6}$ cm$^2$/Vs or more. Note that other than these substances, any substance that has a property of transporting more holes than electrons may be used. Further, the layer containing the substance having a high hole-transport property is not limited to a single layer, and two or more layers containing the above substances may be stacked.

Alternatively, a high-molecular compound such as PVK or PVTPA can be used for the hole-transport layer.

The light-emitting layer is a layer containing a light-emitting substance. The light-emitting layer includes a light-emitting layer containing a light-emitting substance as its main component and a host-guest type light-emitting layer, in which a light-emitting material is dispersed in a host material, and both can be applied.

There is no particular limitation on the light-emitting material that is used, and a known material that emits fluorescence or phosphorescence can be used. Examples of a material that emits fluorescence include, in addition to N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like, materials with an emission wavelength of 450 nm or more, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinit rile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-d iamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4-H-pyran-4-ylidene}propanedinitrile (abbreviation: BisDCJTM). Examples of a material that emits phosphorescence include, in addition to bis[2-(4',6'-difluorophenyl)pyridinato-N,C$^{2'}$]iridium(III)tetrakis(1-pyrazolyl)borate (abbreviation: FIr6), materials with an emission wavelength in the range of 470 nm to 500 nm, such as bis[2-(4',6'-difluorophenyl)pyridinato-N, C$^{2'}$]iridium(III)picolinate (abbreviation: FIrpic), bis[2-(3',5'-bistrifluoromethylphenyl)pyridinato-N,C$^{2'}$]iridium(III)picolinate (abbreviation: Ir(CF$_3$ ppy)$_2$(pic)), and bis[2-(4',6'-difluorophenyl)pyridinato-N,C$^{2'}$]iridium(III)acetylacetonate (abbreviation: FIracac); materials with an emission wavelength of 500 nm or more (materials which emit green light), such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N, C$^{2'}$)iridium(III)acetylacetonate (abbreviation: Ir(bt)$_2$(acac)), bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin-platinum (II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)); and the like. The light-emitting material is selected from the above-mentioned materials or other known materials in consideration of the emission color of each light-emitting element.

Examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation:

BAlq), bis(8-quinolinolato)zinc(II) (abbreviation: Znq), bis[2-(2-benzoxazolyl)phenolato]zinc(II) (abbreviation: Zn(BOX)$_2$), and bis[2-(2-benzothiazolyl)phenolato]zinc(II) (abbreviation: Zn(BTZ)$_2$); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2′,2″-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. Another examples are condensed polycyclic aromatic compounds such as anthracene derivatives, phenanthrene derivatives, pyrene derivatives, chrysene derivatives, and dibenzo[g,p]chrysene derivatives. Specifically, the following substances can be given: N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-{4-[4-(10-phenyl-9-anthryl)phenyl]phenyl}-9H-carbazol-3-amine (abbreviation: PCAPBA), 3,6-diphenyl-9-[4-(10-phenyl-9-anthryl)phenyl]-9H-carbazole (abbreviation: DPCzPA), 9,9′-bianthryl (abbreviation: BANT), 9,9′-(stilbene-3,3′-diyl)diphenanthrene (abbreviation: DPNS), 9,9′-(stilbene-4,4′-diyl)diphenanthrene (abbreviation: DPNS2), 3,3′,3″-(benzene-1,3,5-triyl)tripyrene (abbreviation: TPB3), DPAnth, YGAPA, PCAPA, 2PCAPA, DBC1, CzPA, DPPA, DNA, t-BuDNA, and the like. A substance is selected from these substances or other known substances so as to have a larger energy gap (or triplet excitation energy in the case of phosphorescence) than the light-emitting substance dispersed in the host material and has a carrier-transport property as needed for the light-emitting layer.

The electron-transport layer is a layer that contains a substance having a high electron-transport property, for example, a layer that contains a metal complex having a quinoline skeleton or a benzoquinoline skeleton, such as Alq, Almq$_3$, BeBq$_2$, BAlq. Alternatively, a metal complex having an oxazole-based or thiazole-based ligand, such as Zn(BOX)$_2$ or Zn(BTZ)$_2$ can be used. In addition to the metal complexes, PBD, OXD-7, TAZ, BPhen, BCP, or the like can be used. The substances described here are mainly those having an electron mobility of $10^{-6}$ cm$^2$/Vs or more. Note that other than the above substances, any substance that has a property of transporting more electrons than holes may be used.

In addition, the electron-transport layer is not limited to a single layer, and two or more layers containing the above substances may be stacked.

Further, a layer for controlling electron transport may be provided between the electron-transport layer and the light-emitting layer. This layer for controlling electron transport is a layer which is obtained by adding a substance having a high electron-trapping property in small amounts to any of the above-mentioned materials having a high electron-transport property, and which can adjust carrier balance by suppressing electron transport. Such a structure is very effective in suppressing a problem (such as a decrease of the element lifetime) caused by a phenomenon in which an electron passes through the light-emitting layer.

Further, an electron-injection layer may be provided in contact with the electrode functioning as a cathode. As the electron-injection layer, an alkali metal, an alkaline earth metal, or a compound thereof, such as lithium, cesium, calcium, lithium fluoride, cesium fluoride, calcium fluoride, or the like can be used. For example, it is possible to use a layer formed of a substance having an electron-transport property which includes an alkali metal, an alkaline earth metal, or a compound thereof, such as a layer formed of Alq which includes magnesium. Note that as the electron-injection layer, it is preferable to use a layer formed of a substance having an electron-transport property to which an alkali metal or an alkaline earth metal is added because such a layer enables efficient injection of electrons from the second electrode 120.

Then, the second electrode 120 is formed over the EL layer 119. When the second electrode 120 is used as a cathode, a metal, an alloy, an electrically conductive compound, a mixture thereof, or the like having a low work function (specifically, a work function of 3.8 eV or less), is preferably used as a substance forming the second electrode 120. As specific examples of such a cathode material, elements belonging to Group 1 or Group 2 of the periodic table, i.e., an alkali metal such as lithium or cesium, an alkaline earth metal such as magnesium, calcium, or strontium, an alloy containing any of these metals (such as Mg—Ag or Al—Li), a rare earth metal such as europium or ytterbium, an alloy containing such a rare earth metal, and the like can be given. However, when the electron-injection layer is provided between the cathode and the electron-transport layer, any of a variety of conductive materials such as aluminum, silver, ITO, ITO containing silicon or silicon oxide, and the like can be used as the cathode regardless of its work function. Films of these conductive materials can be formed by a sputtering method, an inkjet method, a spin coating method, or the like.

For the second electrode 120, a stacked layer structure having a mixed film of a metal and an organic material (e.g., aluminum and NPB) and aluminum film can be alternatively used. Such a structure can suppress an increase or expansion of dark spots.

It is preferable that, when the second electrode 120 is used as an anode, a metal, an alloy, a conductive compound, a mixture thereof, or the like having a high work function (greater than or equal to 4.0 eV, specifically) be used. Specifically, ITO, ITO containing silicon or silicon oxide, indium oxide-zinc oxide (IZO: indium zinc oxide), indium oxide containing tungsten oxide and zinc oxide (IWZO), and the like can be given. Such conductive metal oxide films are usually formed by sputtering, but may be formed by using a sol-gel method or the like. For example, an IZO film can be formed by a sputtering method using a target in which 1 wt % to 20 wt % of zinc oxide is added to indium oxide. An IWZO film can be formed by a sputtering method using a target in which 0.5 wt % to 5 wt % of tungsten oxide and 0.1 wt % to 1 wt % of zinc oxide are added to indium oxide. Other than these, gold, platinum, nickel, tungsten, chrome, molybdenum, iron, cobalt, copper, palladium, or a nitride of a metal material (for example, titanium nitride) or the like can be given. When the above-mentioned composite material is provided in contact with the anode, a material of the electrode can be selected regardless of its work function.

Figure 6A:
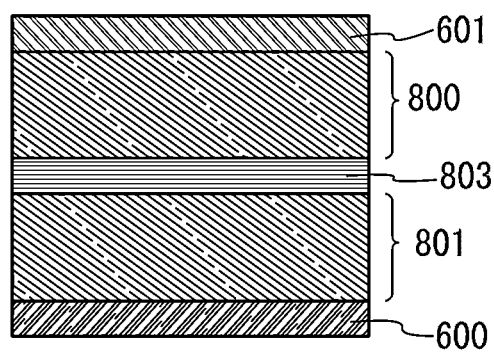
FIGS. 6A and 6B each illustrate a structure of a light-emitting element according to one embodiment.

Note that more than one of the above-mentioned EL layers may be formed between a first electrode 600 and a second electrode 601 as illustrated in FIG. 6A. In this case, a charge generation layer 803 is preferably provided between stacked EL layers 800 and 801. The charge generation layer 803 can be formed by using the above-mentioned composite material. Further, the charge generation layer 803 may have a stacked layer structure formed of a layer containing the composite material and a layer formed of another material. In this case, as the layer formed of another material, it is possible to use a layer containing a substance having an electron-donating property and a substance having a high electron-transport property, a layer formed of a conductive layer having a property of transmitting visible light, or the like. A light-emitting element having such a structure does not easily involve a problem such as energy transfer or quenching and has more choices of materials, thereby readily having both high light emission efficiency and a long lifetime. It is also easy for such a light-emitting element to exhibit phosphorescence from one of the EL layers and fluorescence from the other of the EL layers. This structure can be combined with any of the above-mentioned structures of the EL layer.

Figure 6B:
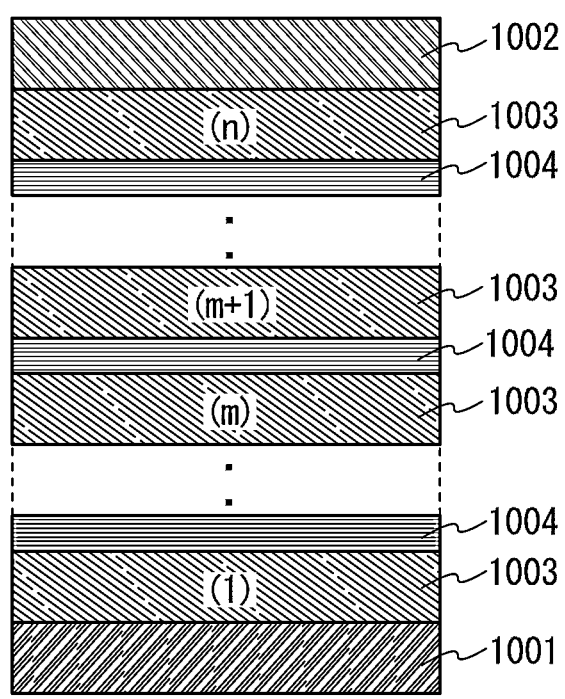

Next, the case where two or more EL layers are stacked between the first electrode and the second electrode will also be described. As illustrated in FIG. 6B, in the case of a structure in which n (n is a natural number greater than or equal to 2) EL layers 1003 are stacked, a charge generation layer 1004 is provided between an m-th (m is a natural number greater than or equal to 1 and less than or equal to n−1) EL layer and an (m+1)-th EL layer.

The charge generation layer 1004 has a function of injecting holes to one of the EL layers 1003 which is formed in contact with the charge generation layer 1004 and a function of injecting electrons to the other of the EL layers 1003 which is formed in contact with the charge generation layer 1004, when a voltage is applied to a first electrode 1001 and a second electrode 1002.

For the charge generation layer 1004, for example, a composite material of an organic compound and a metal oxide can be used. In addition, the charge generation layer 1004 can be formed by combining the composite material of an organic compound and a metal oxide with another material (such as an alkali metal, an alkali earth metal, or a compound thereof). For example, a stacked layer structure including a layer formed of the composite material of an organic compound and a metal oxide and a layer formed of another material (such as an alkali metal, an alkali earth metal, or a compound thereof) may be employed. As the composite material of an organic compound and a metal oxide, for example, an organic compound and a metal oxide such as $V_2O_5$, $MoO_3$, or $WO_3$ can be given. As the organic compound, various compounds such as an aromatic amine compound, a carbazole derivative, aromatic hydrocarbon, an oligomer, a dendrimer, and a polymer can be used. Note that an organic compound having a hole mobility of $10^{-6}$ cm$^2$/Vs or more is preferably used as the organic compound. Other than these substances, any substance that has a property of transporting more holes than electrons may be used. Since these materials used for the charge generation layer 1004 are excellent in carrier-injection property and carrier-transport property, low-current driving of the light-emitting element can be realized.

In particular, the structure illustrated in FIG. 6A is preferred in the case where white light is emitted, so that a light-emitting device having a long lifetime and high efficiency can be manufactured. For example, a full-color flexible light-emitting device can be manufactured by combining a flexible white light-emitting device used for a lighting apparatus with the structure in any of FIGS. 2A to 2D.

A combination of a plurality of light-emitting layers is a structure in which white light is emitted by including red light, blue light, and green light. One example is a structure including a first EL layer containing a blue fluorescent material as a light-emitting substance and a second EL layer containing red and green phosphorescent materials as light-emitting substances. Alternatively, white light can be emitted by a structure including light-emitting layers emitting light of complementary colors. In a stacked element including two stacked EL layers, when light emitted from the first EL layer and light emitted from the second EL layer have complementary colors, combinations of the complementary colors can be blue and yellow, blue-green and red, or the like. A substance emitting blue light, a substance emitting yellow light, a substance emitting blue-green light, and a substance emitting red light are each selected as appropriate from the light-emitting substances given above, for example.

An example of a structure having a plurality of light-emitting layers, in which colors of light from first and second EL layers are complementary colors and from which white light is obtained will be described.

For example, the first EL layer includes a first light-emitting layer which has an emission spectrum with a peak in the wavelength range of blue to blue-green, and includes a second light-emitting layer which has an emission spectrum with a peak in the wavelength range of yellow to orange. The second EL layer includes a third light-emitting layer which has an emission spectrum with a peak in the wavelength range of blue-green to green, and includes a fourth light-emitting layer which has an emission spectrum with a peak in the wavelength range of orange to red.

In this case, light emitted from the first EL layer is a combination of light emitted from both the first and second light-emitting layers and thus exhibits an emission spectrum having both a peak in the wavelength range of blue to blue-green and a peak in the wavelength range of yellow to orange. That is, the first EL layer emits light of two-wavelength type white or a two-wavelength type color close to white.

In addition, light emitted from the second EL layer is a combination of light emitted from both the third and fourth light-emitting layers and thus exhibits an emission spectrum having both a peak in the wavelength range of blue-green to green and a peak in the wavelength range of the range of orange to red. That is, the second EL layer emits light of two-wavelength type white or a two-wavelength type color close to white, which is different from the first EL layer.

Thus, a combination of light emitted from the first EL layer and light emitted from the second EL layer can provide emission of white which covers the wavelength ranges of blue to blue-green, blue-green to green, yellow to orange, and orange to red.

In the above-described structure of the stacked element, the charge generation layer between the stacked EL layers makes it possible to achieve light emission in a high luminance region with current density kept low, and thus a light-emitting element having a long lifetime can be realized. In addition, a voltage drop due to resistance of the electrode material can be reduced, whereby uniform light emission in a large area is possible.

Figure 3E:
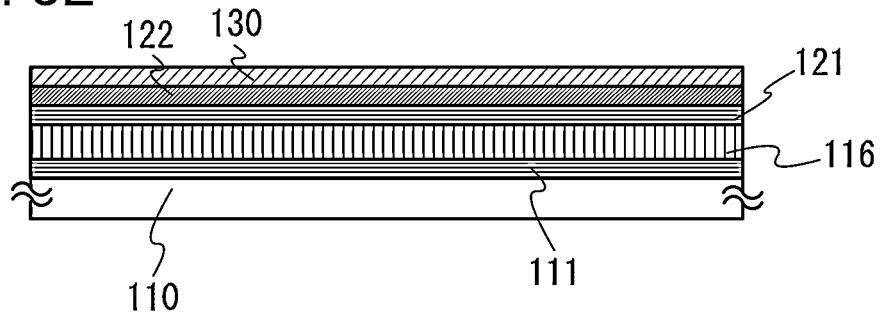

When the steps up to and including the formation of the second electrode 120 are finished, the metal substrate 122 is bonded to the second electrode 120 with use of the second adhesive layer 121. Further, the heat radiation material layer 130 is formed over the metal substrate 122 (FIG. 3E). Materials that can be used for the second adhesive layer 121, the metal substrate 122, and the heat radiation material layer 130 are as given above. Before the metal substrate 122 is bonded with use of the second adhesive layer 121, preferably, baking or plasma treatment is performed in a vacuum so that water adhering to the surface of the metal substrate 122 is removed.

The metal substrate 122 can also be bonded with the use of a laminator. For example, there are a method in which a sheet-like adhesive and the metal substrate are attached to each other using a laminator and then bonded onto the light-emitting element using a laminator, a method in which an adhesive is printed on the metal substrate by screen printing or the like and then the metal substrate with the adhesive is bonded onto the light-emitting element using a laminator, and the like. The step of bonding the metal substrate 122 is preferably performed under reduced pressure in order to reduce bubbles between the light-emitting element and the metal substrate.

In the above manner, a light-emitting device according to one embodiment of the present invention as illustrated in FIGS. 1A and 1C can be manufactured.

This embodiment gives descriptions of the method of fabricating a flexible light-emitting device having a transistor in which the components up to the first electrode 117 of the light-emitting element are formed over the formation substrate and separation is performed, but the invention disclosed in this specification is not limited thereto. The separation and transfer may be performed after the components up to the light-emitting element 127 are formed (that is, after the second electrode 120 of the light-emitting element is formed). Alternatively, a transistor and a light-emitting element may be formed after only the protective layer 112 is formed over the formation substrate and the separation and the transfer to the plastic substrate 110 are performed. In the case where a transistor is not provided, the light-emitting device can be similarly manufactured by starting the process from the formation of the first electrode 117 of the light-emitting element over the protective layer 112.

Note that after the second electrode 120 of the light-emitting element is formed, the film sealing layer 126 may be formed so as to further reduce water permeability, as illustrated in FIG. 1C. The coat layer 124 may be provided on the surface of the plastic substrate 110 which is opposite to the surface of the plastic substrate 110 which is provided with the light-emitting element and the like, thereby preventing scratches on the screen or breaking due to pressure. The resin layer 123 may be provided between the metal substrate 122 and the heat radiation material layer 130 to protect the metal substrate 122.

The plastic substrate 110, the first adhesive layer 111, the second adhesive layer 121, and the resin layer 123 may each include a fibrous body therein. As the fibrous body, a high-strength fiber of an organic compound or an inorganic compound is used. The high-strength fiber specifically means a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, and the like can be given. As the plastic substrate 110, a structure body formed in the following manner may be employed: any of these fibers is used in a state of a woven fabric or a nonwoven fabric, this fibrous body is impregnated with an organic resin, and the organic resin is cured. It is preferable to use the structure body including a fibrous body and an organic resin as the plastic substrate 110, because such use improves reliability against bending or breaking caused by local pressure.

By providing the resin layer 123 including a fibrous body, a flexible light-emitting device highly resistant to bending and breaking (buckling) can be manufactured. As the fibrous body, a glass fiber is preferable, for example. To form the resin layer 123 including a fibrous body, there is a method in which a glass fiber filled with a resin is bonded using an adhesive, or a method in which a glass fiber is filled with an adhesive and this semi-cured resin layer is placed over the metal substrate 122 and then is cured, for example. It is preferable that a material in which a heat radiation material layer is stacked over a fibrous body be bonded over the metal substrate 122 with a viscous adhesive layer interposed therebetween, because such a structure enables formation of the resin layer 123 including the fibrous body and the heat radiation material layer 130 at one time. As an example of the material in which a heat radiation material layer is stacked over a fibrous body and which is to be bonded over the metal substrate 122, "MAZUHARUICHIBAN Soft type" (produced by Oki Electric Industry Co., Ltd., "MAZUHARUICHIBAN" is a registered trademark of Ceramission Co., Ltd.) can be given.

When the plastic substrate 110 or the first adhesive layer 111 includes the above-mentioned fibrous body, the fibrous body is preferably a nanofiber with a diameter of 100 nm or less in order to reduce the degree to which light emitted from a light-emitting element is prevented from being extracted outside. Further, refractive indexes of the fibrous body and the organic resin or the adhesive preferably match with each other.

The structure body, which is obtained in such a manner that the fibrous body is impregnated with an organic resin and the organic resin is cured, can also be used to serve as both the first adhesive layer 111 and the plastic substrate 110. At this time, as the organic resin for the structure body, it is preferable to use a reactive curable resin, a thermal curable resin, a UV curable resin, or the like which is better cured by additional treatment.

Then, an FPC (flexible printed circuit) is attached to each electrode of an input-output terminal portion with use of an anisotropic conductive member. An IC chip or the like may also be mounted if necessary.

Through the above process, a module type light-emitting device to which the FPC is connected is completed.

Figure 4A:
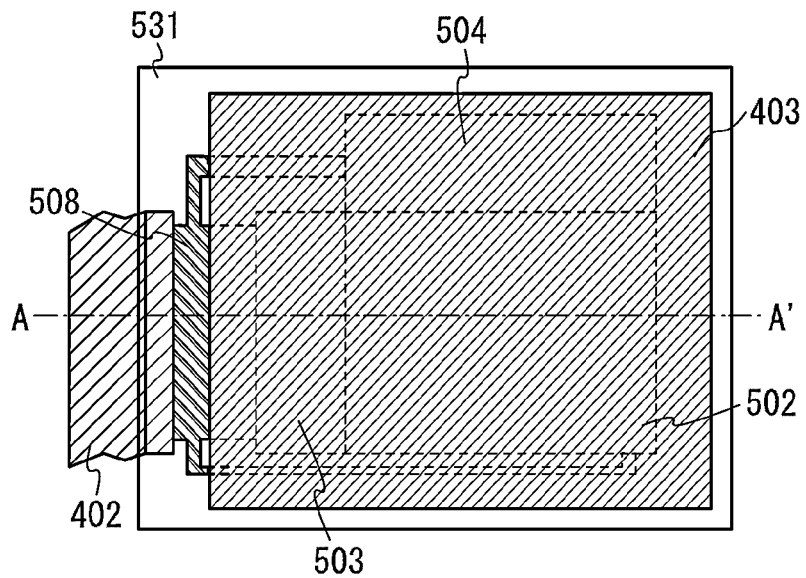
FIGS. 4A to 4C each illustrate a light-emitting device according to one embodiment.
Figure 4B:
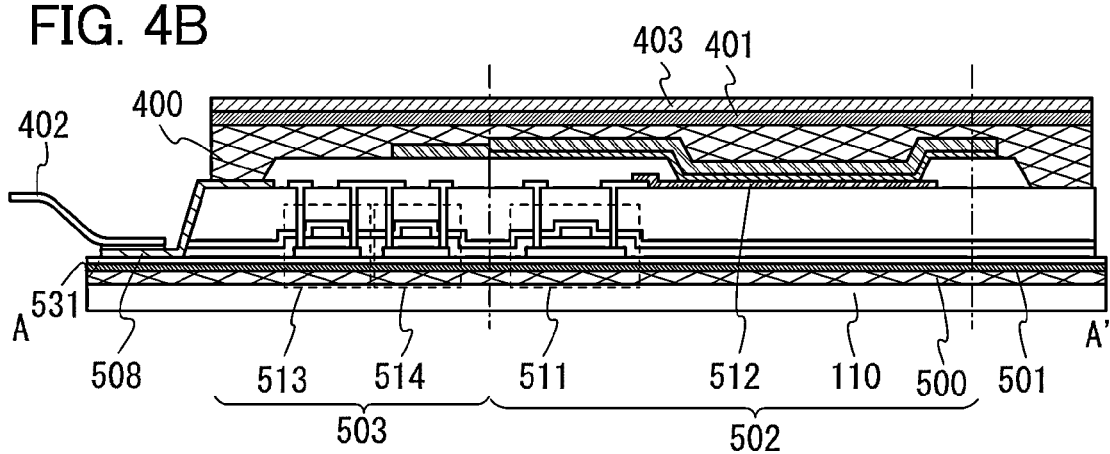
Figure 4C:
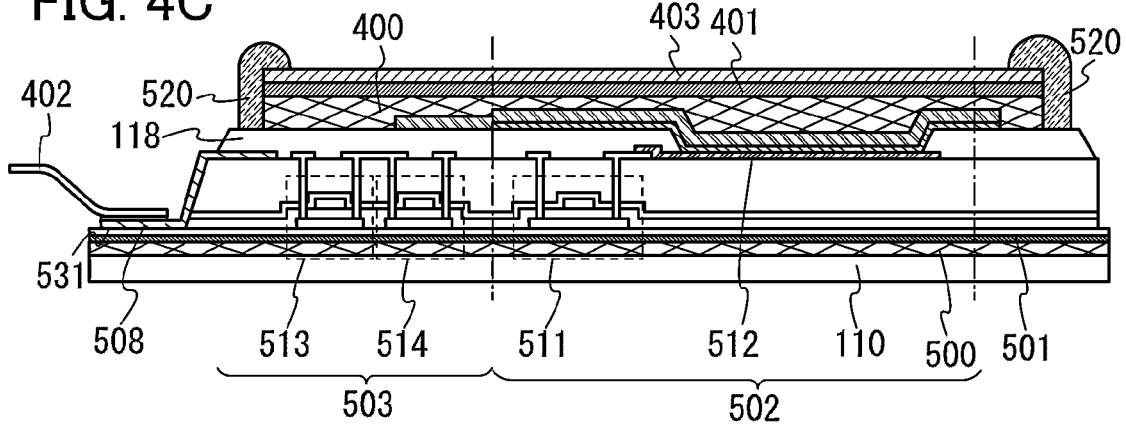

FIG. 4A is a top view of a module type light-emitting device (also referred to as an EL module), and FIGS. 4B and 4C are cross-sectional views thereof.

FIG. 4A is a top view illustrating an EL module, and FIG. 4B is a cross-sectional view along line A-A' of FIG. 4A. In FIG. 4A, a protective layer 501 and a base insulating layer 531 are provided over the plastic substrate 110 with a first adhesive layer 500 interposed therebetween. Over the base insulating layer 531, a pixel portion 502, a source side driver circuit 504, and a gate side driver circuit 503 are formed.

Further, a second adhesive layer 400 is formed over the pixel portion and the driver circuit portions, and a metal substrate 401 is bonded with use of the second adhesive layer 400. Furthermore, a heat radiation material layer 403 is formed over the metal substrate 401.

Note that a wiring 508 is a wiring for transmitting signals input to the source side driver circuit 504 and the gate side driver circuit 503, and receives video signals or clock signals from an FPC 402 which is an external input terminal. Although only the FPC 402 is illustrated here, this FPC may be provided with a printed wiring board (PWB). The flexible light-emitting device disclosed in this specification means not only the light-emitting device itself but also a device in which the FPC or the PWB is attached to the light-emitting device.

Next, a cross-sectional structure will be described with reference to FIG. 4B. The protective layer 501 and the base insulating layer 531 are provided on and in contact with the first adhesive layer 500. The pixel portion 502 and the gate side deriver circuit 503 are formed over the base insulating layer 531. The pixel portion 502 is formed of a plurality of pixels each including a current control transistor 511 and a pixel electrode 512 electrically connected to a drain of the current control transistor 511. Further, the gate side driver circuit 503 is formed using a CMOS circuit that includes an n-channel transistor 513 and a p-channel transistor 514.

FIG. 4C illustrates an example of a cross-sectional structure which is different from that in FIG. 4B. In the example of FIG. 4C, the partition wall 118 is formed with an inorganic material such as silicon nitride, silicon oxynitride, silicon nitride oxide, or silicon oxide. The peripheral end portions of the second adhesive layer 400, the metal substrate 401, and the heat radiation material layer 403 are placed closer to the center of the flexible light-emitting device than the peripheral end portion of the partition wall 118. In other words, having a smaller area than the partition wall 118, the second adhesive layer 400, the metal substrate 401, and the heat radiation material layer 403 are placed over the partition wall 118 in such a manner that they do not extend beyond the partition wall 118. Then, a low-melting point metal 520 is formed so as to cover a side surface of the second adhesive layer 400. With the low-melting point metal 520, moisture can be blocked highly effectively at the end portion on a side surface of the second adhesive layer 400, and thus, the lifetime of the flexible light-emitting device can be further improved. There is no particular limitation on the low-melting point metal 520, but a metal material that can be fused at approximately 45° C. to 300° C. is preferably used. When the fusion temperature is about 300° C., the temperature rises locally in the peripheral portion of the pixel portion and over the partition wall, so that the low-melting point metal can be fused without damaging a light-emitting element or the plastic substrate. As such a material, a metal material containing tin, silver, copper, indium, or the like can be given. In addition, bismuth or the like may be further contained therein.

As described above, in the flexible light-emitting device described in this embodiment, a transistor can be formed over a formation substrate with high heat resistance and thus a transistor using a crystalline semiconductor layer such as crystalline silicon having high mobility can be formed. Accordingly, a driver circuit portion including such a transistor and the pixel portion can be formed over one substrate at the same time, whereby the flexible light-emitting device can be manufactured at lower cost.

In the flexible light-emitting device fabricated by the method described in this embodiment, the protective layer having sufficiently low water permeability which is formed at a temperature greater than or equal to the upper temperature limit of the plastic substrate is provided on the plastic substrate side which has high water permeability, whereby the influence of moisture which penetrates through the plastic substrate can be effectively reduced. In addition, since the metal substrate having sufficient flexibility and low water permeability is used as a sealing substrate which faces the plastic substrate with the light-emitting element interposed therebetween, the influence of moisture which penetrates through the sealing substrate can also be effectively suppressed. In this manner, on both sides of the light-emitting element, it is possible to effectively reduce moisture which penetrates without stacking a large number of layers. Further, the heat radiation material layer provided over the metal substrate makes it possible to suppress an increase in the surface temperature of the light-emitting device, thereby preventing problems such as the breakdown of the light-emitting device and a reduction in its reliability, which are caused by heat generation. Thus, with low surface temperature, the flexible light-emitting device in this embodiment can have a long lifetime and high reliability.

(Embodiment 2)

This embodiment will provide descriptions of an electronic device and lighting apparatuses, each of which includes the light-emitting device described in Embodiment 1 as a part, referring to FIGS. 5A, 5B-1, and 5B-2.

Examples of the electronic device having the light-emitting device described in Embodiment 1 include cameras such as video cameras or digital cameras, goggle type displays, navigation systems, audio playback devices (e.g., car audio systems and audio systems), computers, game machines, portable information terminals (e.g., mobile computers, mobile phones, portable game machines, and electronic book devices), image playback devices in which a recording medium is provided (specifically, devices that are capable of playing back recording the contents in media such as digital versatile discs (DVDs) and equipped with a display unit that can display the image), and the like.

Figure 5A:
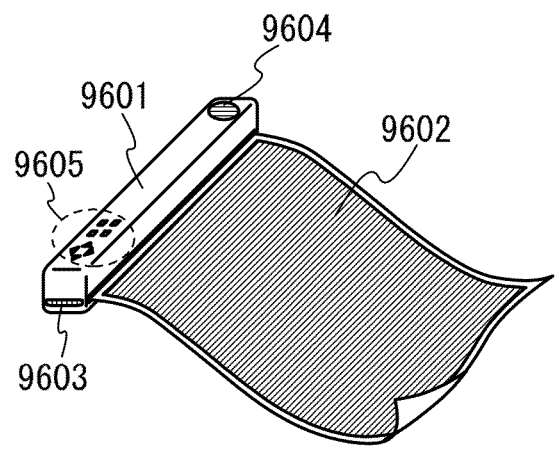
FIGS. 5A, 5B-1, and 5B-2 each illustrate an electronic device or a lighting device according to one embodiment.
Figures 1, 5B:
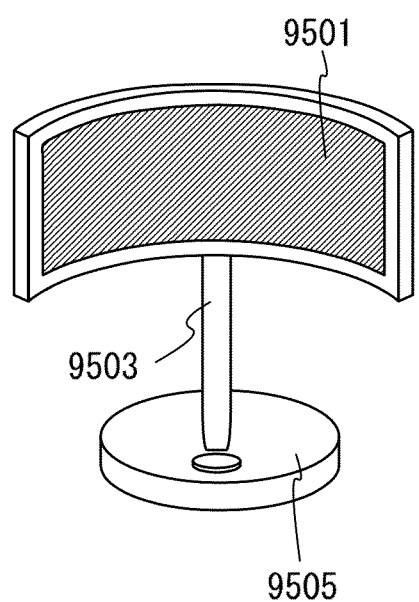
Figures 2, 5B:
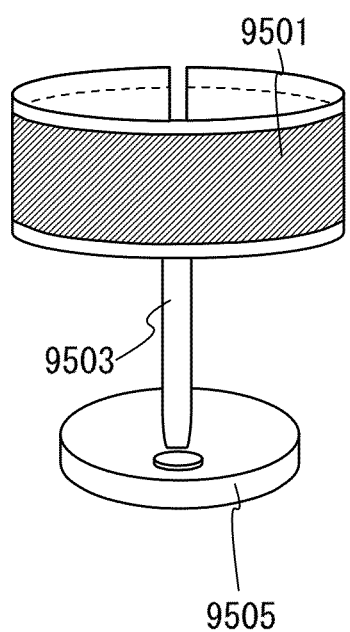

FIG. 5A illustrates a display which includes a main body 9601, a display portion 9602, an external memory insertion portion 9603, a speaker portion 9604, operation keys 9605, and the like. The main body 9601 may be provided with an antenna for receiving a television broadcast, an external input terminal, an external output terminal, a battery, and the like. In this display, the display portion 9602 is manufactured using the light-emitting device described in Embodiment 1. The flexible display portion 9602 can be rolled up and stored in the main body 9601 and the display is suitable for being carried. The display provided with the light-emitting device described in Embodiment 1, which is flexible, has a long lifetime, and can easily be manufactured, can be a relatively inexpensive product with a long lifetime while making the display portion 9602 suitable for being carried and light-weight.

The light-emitting device described in Embodiment 1 can be used also as a lighting apparatus. For example, FIGS. 5B-1 and 5B-2 each illustrate a desk lamp having a lighting portion 9501, a support 9503, a support base 9505, and the like. Each lighting portion 9501 includes the light-emitting device described in Embodiment 1. Since the flexible light-emitting device is used for each lighting portion 9501, the lighting apparatuses described in this embodiment can each be a lighting apparatus having a curved surface or having a flexible lighting portion. Such use of the flexible light-emitting device for a lighting apparatus not only improves the degree of freedom in design of the lighting apparatus but also enables the lighting apparatus to be mounted onto a portion having a curved surface, such as the ceiling of a car. Use of the flexible light-emitting device also enables manufacture of a lighting apparatus having a lighting portion that can be rolled up and stored when not in use, such as a roller screen type lighting apparatus, for example. Note that the lighting apparatus also means a ceiling light (a ceiling-fixed lighting apparatus), a wall light (a wall-hanging lighting apparatus), and the like.

Note that the lighting apparatus of this embodiment which is manufactured by using any of the above embodiments can be a highly reliable lighting apparatus.

In the above-described manner, an electronic device or a lighting apparatus can be obtained by using the light-emitting device described in the above embodiment. The application range of the light-emitting device is wide so that it can be applied to electronic devices or lighting apparatuses in all fields, without limitation to the structure illustrated in FIGS. 5A, 5B-1, and 5B-2.

EXAMPLE 1

Figure 7A:
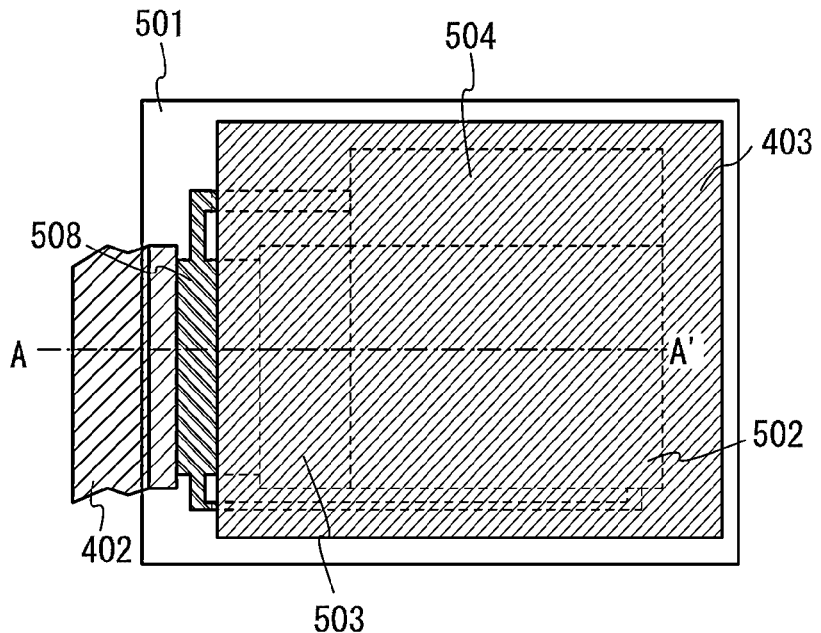
FIGS. 7A to 7C illustrate a light-emitting device according to one example.
Figure 7B:
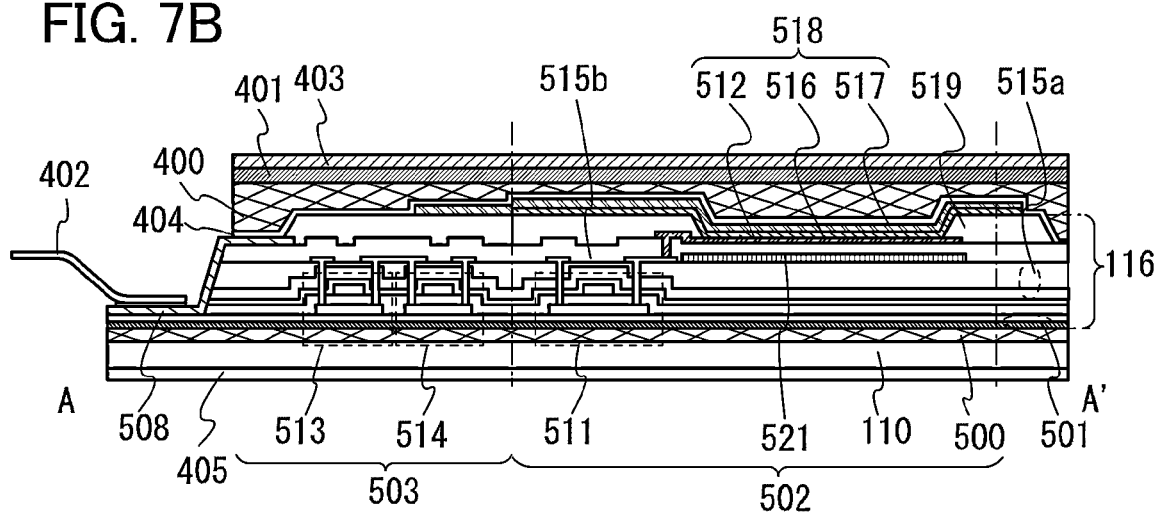

In this example, an active matrix flexible light-emitting device which can be used as an image display device will be described. FIGS. 7A and 7B illustrate a structure of the light-emitting device described in this example. FIG. 7A is a top view of the active matrix light-emitting device, and FIG. 7B is a cross-sectional view along line A-A' of FIG. 7A.

The flexible light-emitting device described in this example has a coat layer 405, the plastic substrate 110, the layer 116 to be separated, a light-emitting element 518, a film sealing layer 404, the metal substrate 401, and the heat radiation material layer 403.

The plastic substrate 110, to which the layer 116 to be separated is transferred, includes an aramid film having a thermal expansion coefficient of about 10 ppm/K and a thickness of 20 μ.m. In addition, the first adhesive layer 500 which bonds the plastic substrate 110 and the layer 116 to be separated includes a two component type epoxy adhesive (R2007/H-1010, produced by ALTECO INC.). Further, the plastic substrate 110 has the surface provided with a 50-nm-thick film of indium oxide-tin oxide alloy (ITO) as the coat layer 405 which is opposite to the surface of the plastic substrate 110 which is bonded to the layer 116 to be separated.

The layer 116 to be separated includes the protective layer 501, the pixel portion 502, the gate side driver circuit 503, and the source side driver circuit 504. In addition, the pixel portion 502 has the current control transistor 511 and the pixel electrode 512. The pixel electrode 512 is electrically connected to a drain electrode layer of the current control transistor 511. The current control transistor 511 is a p-channel transistor and the pixel electrode 512 is an anode of the light-emitting element 518.

The protective layer 501 is formed of a multi-layer film including a 200-nm-thick silicon oxynitride ($SiO_xN_y$, x>y) layer, a 200-nm-thick silicon nitride ($SiN_y$) layer, a 200-nm-thick silicon oxynitride ($SiO_xN_y$, x>y) layer, a 140-nm-thick silicon nitride oxide ($SiN_yOx$, x<y) layer, and a 200-nm-thick silicon oxynitride ($SiO_xN_y$, x>y) layer. With such a stacked layer structure, water vapor or oxygen can be prevented from penetrating into the light-emitting device from the lower portion of the substrate.

The transistor described in this example is a staggered transistor which has a gate insulating layer over a semiconductor layer, a gate electrode layer overlapping with the semiconductor layer with the gate insulating layer interposed therebetween, and a source electrode layer and a drain electrode layer which are electrically connected to a source region and a drain region respectively in the semiconductor layer. The semiconductor layer of the transistor includes a 50-nm-thick polysilicon layer, and the gate insulating layer includes a 110-nm-thick silicon oxynitride ($SiO_xN_y$, x>y) film.

Although not illustrated, the gate electrode layer is formed of two layers, and a lower layer of the gate electrode layer is longer than an upper layer thereof. The lower layer of the gate electrode layer is a 30-nm-thick tantalum nitride layer, and the upper layer thereof is a 370-nm-thick tungsten layer. With such a structure, an LDD (lightly doped drain) region can be formed without using another photomask.

A first interlayer insulating layer 515a, which is over the gate insulating layer and the gate electrode layer, is formed of a multi-layer film that is a stack of a 50-nm-thick silicon oxynitride ($SiO_xN_y$, x>y) layer, a 140-nm-thick silicon nitride oxide ($SiN_yO_x$, x<y) layer, and a 520-nm-thick silicon oxynitride ($SiO_xN_y$, x>y) layer. A color filter layer 521 is provided over the first interlayer insulating layer 515a.

The source electrode layer and the drain electrode layer are formed so as to be connected to the source region and the drain region respectively in the transistor through contact holes in the first interlayer insulating layer 515a. The source and drain electrode layers are formed of a multi-layer film having a 100-nm-thick titanium layer, a 700-nm-thick aluminum layer, and a 100-nm-thick titanium layer. In this manner, by stacking aluminum with low electric resistance and titanium with excellent heat resistance, it is possible to suppress wiring resistance and prevent generation of a hillock during the process. A wiring layer is also formed of the same multilayer although not illustrated.

A second interlayer insulating layer 515b formed over the transistor is a 150-nm-thick silicon oxynitride ($SiO_xN_y$, x>y) layer.

The pixel electrode (first electrode) 512 is a 110-nm-thick film of indium tin oxide containing silicon oxide (ITSO). In addition, an end portion of the pixel electrode 512 is covered with a partition wall 519 including photosensitive polyimide. An end portion of the partition wall 519 is in contact with a surface of the pixel electrode 512 and has a gentle angle. A step at the end portion of the partition wall 519 which has a gentle angle and is in contact with the surface of the pixel electrode 512 is reduced, whereby the pixel electrode 512 and the other electrode are not easily short-circuited in a light-emitting element in which the pixel electrode 512 serves as one electrode.

In this example, the layer 116 to be separated is fabricated over a separation layer which is formed over a glass substrate (AN100, produced by Asahi Glass Co., Ltd.) having a thickness of 0.7 mm The separation layer is formed of a multi-layer film that is a stack of a 100-nm-thick silicon oxynitride ($SiO_xN_y$, x>y) layer and a 50-nm-thick tungsten layer.

Figure 7C:
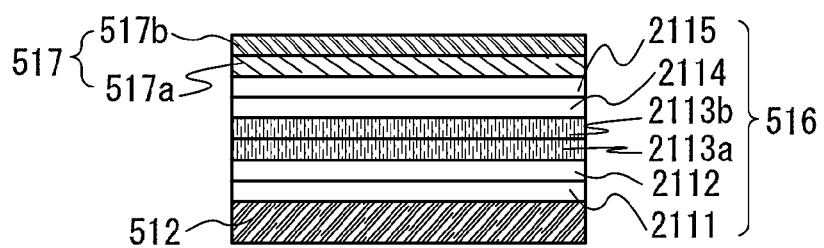

FIG. 7C illustrates the structure of the light-emitting element 518 in which the pixel electrode 512 serves as one electrode. In the light-emitting element 518, the pixel electrode 512 serves as a first electrode, and an EL layer 516 is provided between a second electrode 517 and the pixel electrode 512. Chemical formulae of materials used in this example are illustrated below.

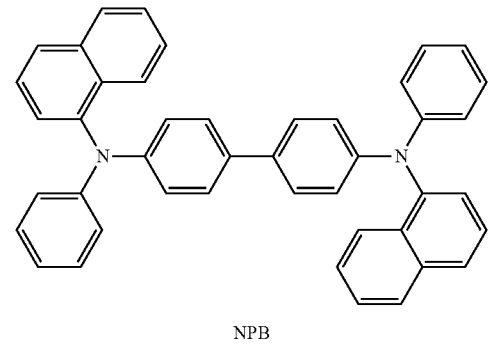

NPB

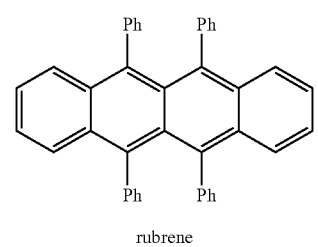

rubrene

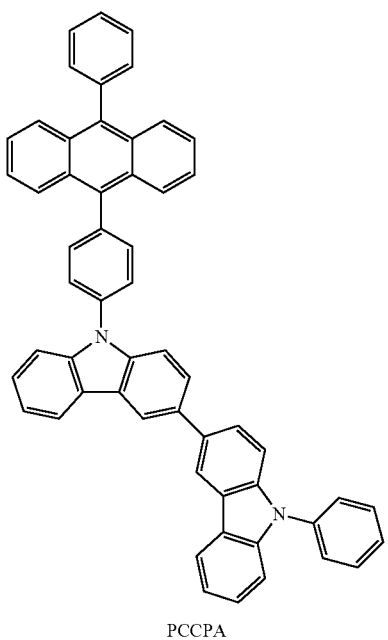

PCCPA

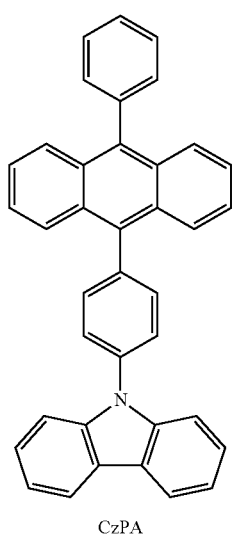

CzPA

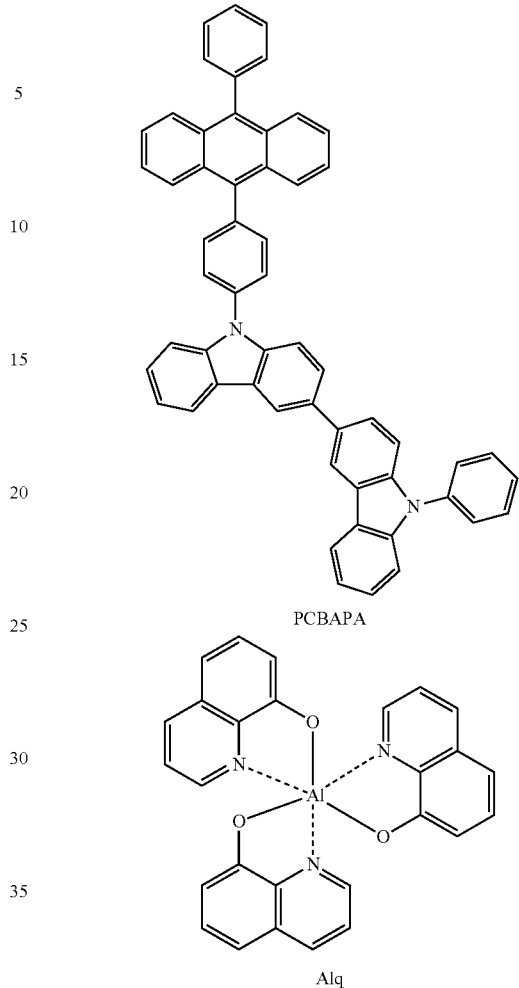

PCBAPA

Alq

A manufacturing method of the light-emitting element of this example will be described below.

First, a substrate provided with the pixel electrode 512 was fixed to a substrate holder in a vacuum evaporation apparatus so that the surface of the substrate, which is provided with the pixel electrode 512, faced downward. After the pressure was lowered to approximately $10^{-4}$ Pa, a hole-injection layer 2111 containing a composite material of an organic compound and an inorganic compound was formed adjacent to the pixel electrode 512 by co-evaporation of 4,4'-bis[N-(1-naphthyl)-N-phenylamino]biphenyl (abbreviation: NPB) and molybdenum(VI) oxide. The thickness of the hole-injection layer 2111 was 200 nm, and the weight ratio of NPB to molybdenum(VI) oxide was adjusted to 1:0.11 (=NPB:molybdenum(VI) oxide). Note that the co-evaporation method is an evaporation method in which evaporation is performed from more than one evaporation sources at the same time in one treatment chamber.

Next, an NPB film was formed to a thickness of 10 nm over the hole-injection layer 2111 by an evaporation method using resistive heating to form a hole-transport layer 2112.

Further, 9-phenyl-9'-[4-(10-phenyl-9-anthryl)phenyl]-3,3'-bi(9H-carbazole) (abbreviation: PCCPA) and rubrene were co-evaporated over the hole-transport layer 2112, thereby forming a first light-emitting layer 2113a. The thickness of the first light-emitting layer 2113a was 20 nm. The evaporation rate was adjusted such that the weight ratio of PCCPA to rubrene was 1:0.01 (=PCCPA:rubrene).

Then, a second light-emitting layer 2113b was formed over the first light-emitting layer 2113a by co-evaporation of 9-[4-(10-phenyl-9-anthryl)phenyl]-9H-carbazole (abbreviation: CzPA) and 4-(10-phenyl-9-anthryl)-4'-(9-phenyl-9H-carbazol-3-yl)triphenylamine (abbreviation: PCBAPA). The thickness of the second light-emitting layer 2113b was 30 nm, and the evaporation rate was adjusted such that the weight ratio of CzPA to PCBAPA was 1:0.1 (=CzPA:PCBAPA).

Next, tris(8-quinolinolato)aluminum (abbreviation: Alq) was evaporated to a thickness of 30 nm over the second light-emitting layer 2113b, thereby forming an electron-transport layer 2114.

Further, lithium fluoride (LiF) was evaporated over the electron-transport layer 2114, whereby an electron-injection layer 2115 was formed. The thickness of the electron-injection layer 2115 was 1 nm.

Lastly, the second electrode 517 serving as a cathode was formed. The second electrode 517 was formed as two layers. A first conductive layer 517a which is in contact with the electron-injection layer 2115 was formed by co-evaporation of aluminum and NPB. The weight ratio of aluminum to NPB was adjusted to 5:1 (=Al:NPB). In addition, the thickness of the first conductive layer 517a was 100 nm. Further, as a second conductive layer 517b, aluminum was evaporated over the first conductive layer 517a to a thickness of 100 nm Note that the second electrode 517 was connected to a terminal portion through a common electrode layer.

Further, in the above evaporation processes, a resistive heating method can be used for each evaporation.

Over the layer 116 to be separated and the light-emitting element 518, a 200-nm-thick silicon nitride layer was formed as the film sealing layer 404.

The metal substrate 401 was bonded to the film sealing layer 404 with the second adhesive layer 400 interposed therebetween. The metal substrate 401 is formed of a ferritic stainless steel substrate (YUS205-M1, produced by Nippon Steel Materials Co., Ltd.) having a thermal expansion coefficient of about 10 ppm/K and a thickness of 20 μm. The second adhesive layer 400 includes a two component type epoxy adhesive (SCANDIPLEX, produced by SCAN-DIA).

Then, a 300-μm-thick sheet of "MAZUHARUICHIBAN Soft Type" (produced by Oki Electric Industry Co., Ltd., "MAZUHARUICHIBAN" is a registered trademark of Ceramission Co., Ltd.) was bonded onto the metal substrate 401. Thus, the viscous adhesive layer, the resin layer including a glass fiber, and the heat radiation material layer 403 were formed.

The flexible light-emitting device described in this example is manufactured in accordance with the manufacturing method described in Embodiment 1. Specifically, first, the layer 116 to be separated which includes the protective layer 501, the pixel electrode 512 serving as a first electrode, and the like was formed over the separation layer which was formed over the formation substrate. Then, the layer 116 to be separated was transferred from the formation substrate to the plastic substrate 110 having a property of transmitting visible light and flexibility, with the use of a temporary supporting substrate. After that, the EL layer 516 and the second electrode 517 were formed over the pixel electrode 512 to form the light-emitting element 518. Then, the film sealing layer 404 was formed over the layer 116 to be separated and the light-emitting element 518, and the metal substrate 401 was bonded onto the film sealing layer 404 with use of the second adhesive layer 400, whereby the layer 116 to be separated and the light-emitting element 518 were sealed. Lastly, the heat radiation material layer 403 was formed over the metal substrate 401. Thus, the light-emitting device was manufactured.

An examination was carried out of the temperature distribution of the surface of the metal substrate in the flexible light-emitting device described in this example. First, the temperature inside the device at each luminance was measured with the flexible light-emitting device for which the steps up to and including the formation of the metal substrate 401 were finished. Next, the heat radiation material layer 403 was formed over the metal substrate 401. Then, the temperature inside the device at each luminance was measured with the flexible light-emitting device for which the steps up to and including the formation of the heat radiation material layer 403 were finished. In this manner, the measurements were carried out about a difference in temperature distribution inside the light-emitting device which depends on the presence or absence of the heat radiation material layer 403.

The measurements of the temperature were performed while the light-emitting device was prevented from touching other articles. The temperature measurements were carried out at six luminances: 70 cd/m$^2$, 100 cd/m$^2$, 120 cd/m$^2$, 130 cd/m$^2$, 150 cd/m$^2$, and 200 cd/m$^2$.

Figure 8:
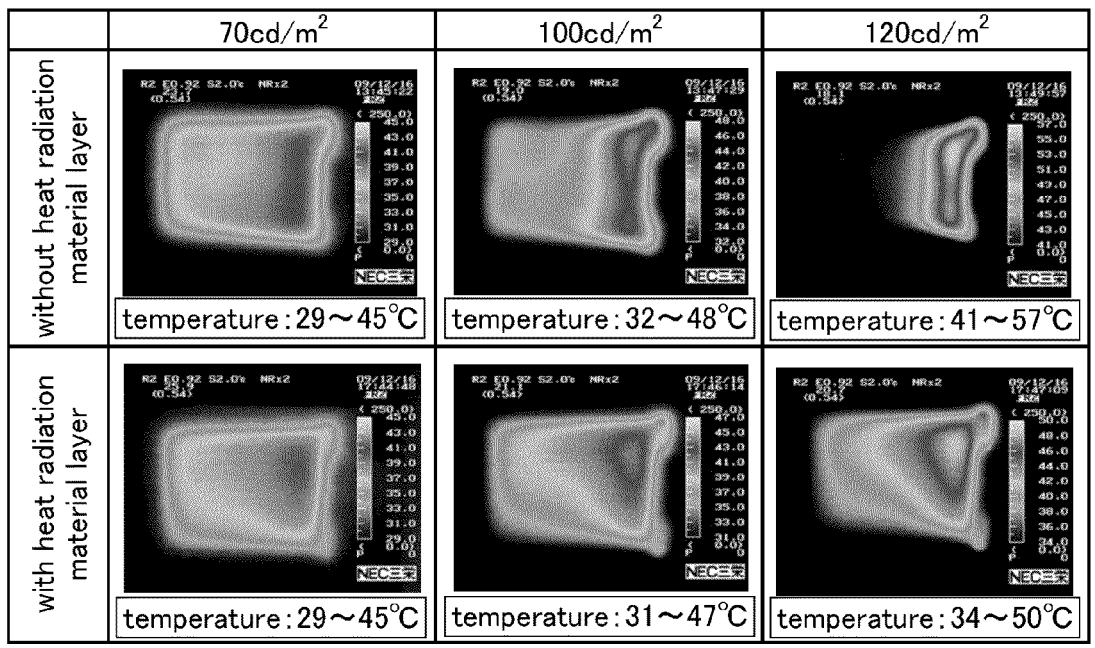
FIG. 8 shows light-emitting devices according to one example.
Figure 8:
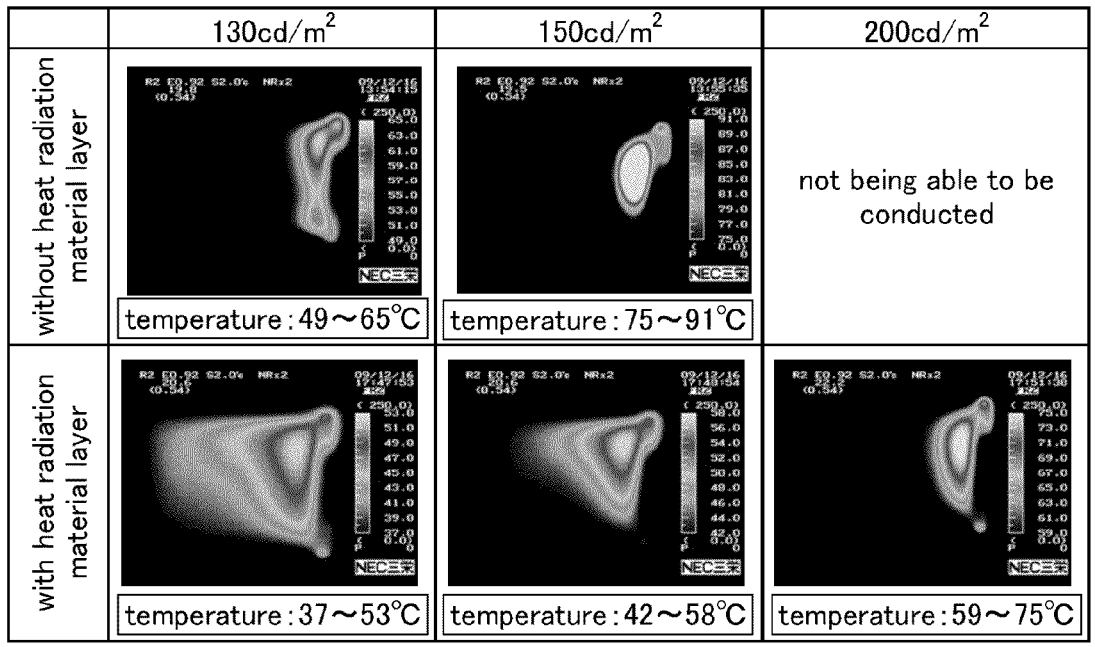

FIG. 8 shows photographs of the temperature distributions inside the light-emitting device at the respective luminances. At luminances of 100 cd/m$^2$ or more, the temperatures inside the light-emitting device having the heat radiation material layer are found low as compared with those inside the light-emitting device that does not have the heat radiation material layer.

In the case of the light-emitting device that does not have the heat radiation material layer, the temperature range covers as high as 75° C. to 91° C. at 150 cd/m$^2$. Any higher luminance for the measurement would have caused an abnormality in appearance, and thus the measurement at 200 cd/m$^2$ was not being able to be conducted. In contrast, with the light-emitting device having the heat radiation material layer, the measurement was able to be carried out even at 200 cd/m$^2$.

Figure 9:
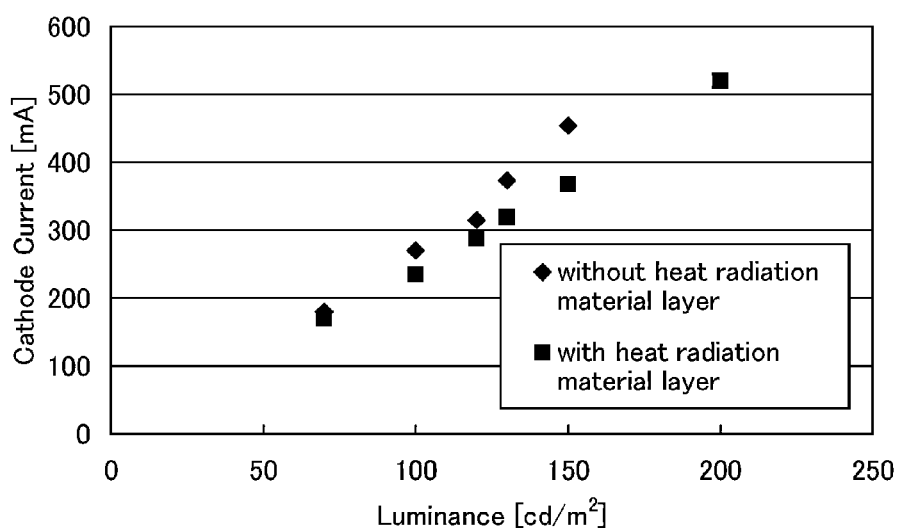
FIG. 9 shows luminance vs. cathode current characteristics of light-emitting devices according to one example.

Luminance vs. cathode current characteristics of the flexible light-emitting devices are illustrated in FIG. 9. In FIG. 9, the horizontal axis represents luminance (cd/m$^2$) and the vertical axis represents cathode current (mA). As apparent from FIG. 9, the cathode current at each luminance is low in the light-emitting device having the heat radiation material layer, as compared with the cathode current of the light-emitting device that does not have the heat radiation material layer.

Figure 10A:
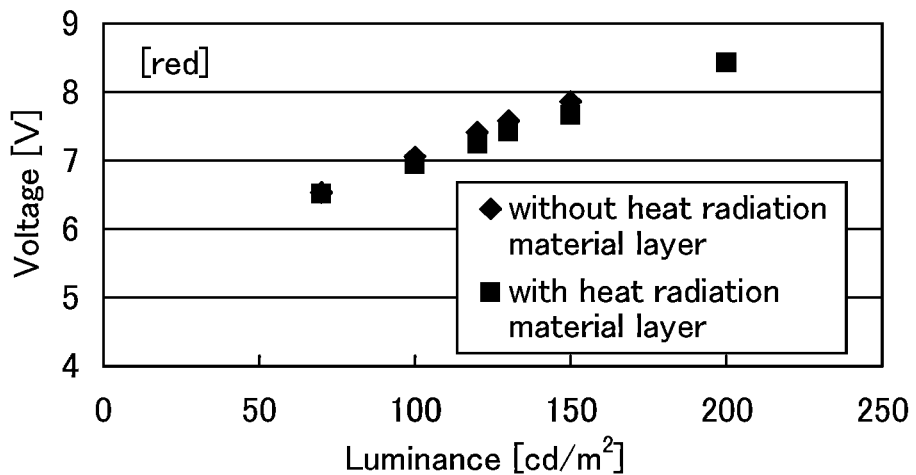
FIGS. 10A to 10C shows luminance vs. voltage characteristics of light-emitting devices according to one example.
Figure 10B:
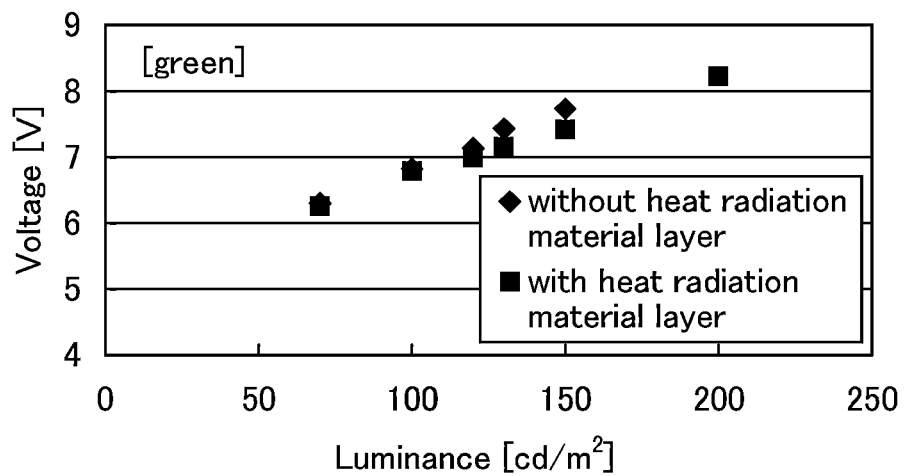
Figure 10C:
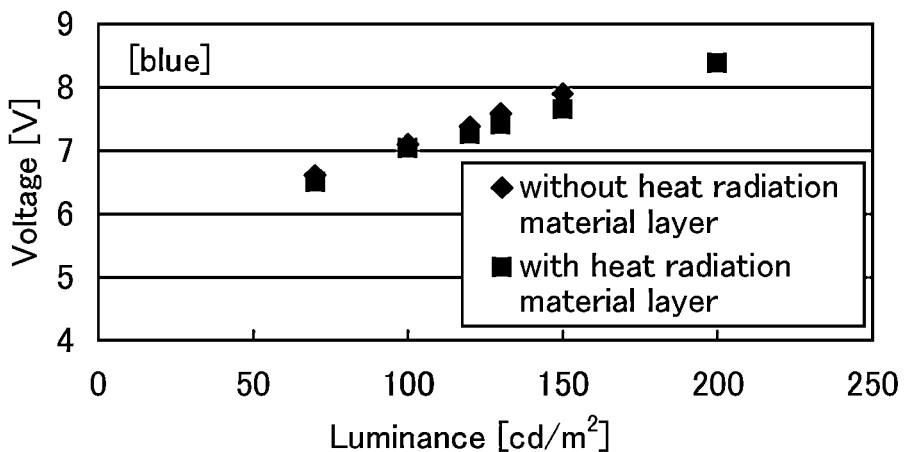

FIGS. 10A to 10C each illustrate luminance vs. voltage characteristics of the flexible light-emitting devices. In each of FIGS. 10A to 10C, the horizontal axis represents luminance (cd/m$^2$) and the vertical axis represents voltage (V). FIG. 10A shows the luminance vs. voltage characteristics measured when the devices displayed red, FIG. 10B shows those measured when the devices displayed green, and FIG. 10C shows those measured when the devices displayed blue. When any color is displayed, the voltage necessary for a certain luminance is found low in the light-emitting device having the heat radiation material layer, as compared with the voltage necessary for the same luminance in the light-emitting device that does not have the heat radiation material layer.

The above results reveal that the heat radiation material layer included in the flexible light-emitting device of this example can reduce the temperature of the metal substrate in a display device. Thus, with the flexible light-emitting device of this example, it is possible to suppress an increase in the surface temperature, thereby preventing an increase in drive voltage, the breakdown, and a decrease in its reliability of the light-emitting device which are caused by heat generation.

Figure 11:
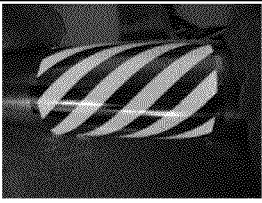
FIG. 11 shows a light-emitting device according to one example.
Figure 11:
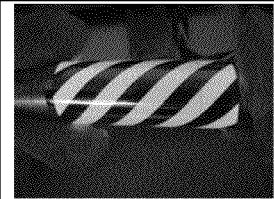
Figure 11:
Figure 11:
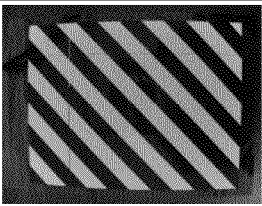
Figure 11:
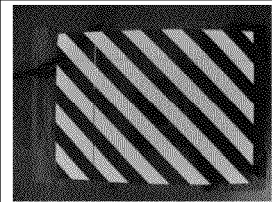
Figure 11:
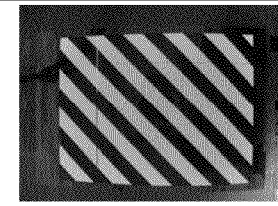

Further, a video signal was input to a flexible light-emitting device having the heat radiation material layer illustrated in this example while the flexible light-emitting device was wrapped around a cylinder whose radius was 7.5 mm to 15 nm. The light-emitting device responded to the video signal and operated normally while being bent into a cylindrical shape. Further, when the light-emitting device was taken off the cylinder and driven, it operated normally in a flat shape. Photographs of the light-emitting states are shown in FIG. 11.

The light-emitting device described in this example includes the layer to be separated which is formed using the formation substrate having high heat resistance. As a result, the layer to be separated can be formed using a high-temperature process; thus, a protective layer with a high moisture-proof property can be easily formed, and the light-emitting element can be reliably and inexpensively protected. In addition, the light-emitting device given as an example is flexible and can emit light either in a bent state or a flat state.

The light-emitting device in given as an example includes a thin film and a metal thin plate. Therefore, the light-emitting device is lightweight and less deformed after being dropped; moreover, since it is highly flat and curls less along with a change in use environment, the driver circuit of the display device is difficult to break. Accordingly, the light-emitting device given as an example is suitable to the use in flexible displays. Further, since the light-emitting device is thin, it can be placed in a narrow space or disposed by being deformed along a curved surface. In addition, the light-emitting device is lightweight and thus is suitable to the use in a device whose weight is strictly restricted, such as a portable device or an airplane.

This application is based on Japanese Patent Application serial no. 2010-010421 filed with the Japan Patent Office on Jan. 20, 2010, the entire contents of which are hereby incorporated by reference.

What is claimed is:

1. A light-emitting device comprising:
   a substrate having a light-transmitting property with respect to visible light;
   a first adhesive layer over the substrate;
   an insulating layer over the first adhesive layer;
   a light-emitting element comprising a first electrode formed over the insulating layer, a second electrode facing the first electrode, and a layer including an organic compound having a light-emitting property between the first electrode and the second electrode,
   a second adhesive layer over the second electrode;
   a metal substrate over the second adhesive layer;
   a resin layer over the metal substrate; and
   a heat radiation material layer over the resin layer,
   wherein the substrate includes an inorganic filler having a particle diameter of 40 nm or less, and
   wherein the heat radiation material layer is a titanium oxide layer, an iron oxide layer, an aluminum oxide layer, a copper oxide layer, or a ceramic material layer.

2. The light-emitting device according to claim 1,
   wherein a film sealing layer is formed between the second electrode of the light-emitting element and the second adhesive layer.

3. The light-emitting device according to claim 1,
   wherein the metal substrate comprises a material selected from stainless steel, aluminum, copper, nickel, and an aluminum alloy.

4. The light-emitting device according to claim 1,
   wherein the first adhesive layer comprises at least one selected from an epoxy resin, an acrylic resin, a silicone resin, and a phenol resin.

5. The light-emitting device according to claim 1,
   wherein the first adhesive layer includes a thermally conductive filler.

6. The light-emitting device according to claim 5,
   wherein a thermal conductivity of the thermally conductive filler is higher than a thermal conductivity of another material used in the first adhesive layer.

7. The light-emitting device according to claim 1,
   wherein the second adhesive layer comprises at least one selected from an epoxy resin, an acrylic resin, a silicone resin, and a phenol resin.

8. The light-emitting device according to claim 1,
   wherein the second adhesive layer includes a thermally conductive filler.

9. The light-emitting device according to claim 8,
   wherein a thermal conductivity of the thermally conductive filler is higher than a thermal conductivity of another material used in the second adhesive layer.

10. The light-emitting device according to claim 1,
    wherein the resin layer includes at least one thermosetting resin selected from an epoxy resin, an acrylic resin, a silicone resin, a phenol resin, and a polyester resin, or includes at least one thermoplastic resin selected from polypropylene, polyethylene, polycarbonate, polystyrene, polyamide, polyetherketone, a fluorine resin, and polyethylenenaphthalate.

11. The light-emitting device according to claim 1,
    wherein at least one of the substrate having the light-transmitting property, the first adhesive layer, and the second adhesive layer further includes a fibrous body.

12. The light-emitting device according to claim 11,
    wherein the fibrous body is a glass fiber.

13. The light-emitting device according to claim 1,
    wherein a waterproof layer is formed between the substrate having the light-transmitting property and the first adhesive layer.

14. The light-emitting device according to claim 13,
    wherein the waterproof layer is a layer including silicon and nitrogen or a layer including aluminum and nitrogen.

15. The light-emitting device according to claim 1,
    wherein the substrate having the light-transmitting property includes a surface facing the metal substrate, and includes a surface opposite to the surface facing the metal substrate being provided with a coat layer.

16. The light-emitting device according to claim 15,
    wherein the coat layer has a property of transmitting visible light and high hardness.

17. The light-emitting device according to claim 15,
    wherein the coat layer is a conductive layer having a property of transmitting visible light.

18. The light-emitting device according to claim 1,
    wherein the insulating layer comprises a layer including silicon and nitrogen.

19. The light-emitting device according to claim 1,
    wherein the substrate has flexibility.

20. The light-emitting device according to claim 1,
    wherein the light-emitting device is a flexible light-emitting device.

21. An electronic device comprising the light-emitting device according to claim 1 in a display portion.

22. A lighting apparatus comprising the light-emitting device according to claim 1.

23. The light-emitting device according to claim 1,
    wherein a surface of the substrate is uneven.

24. The light-emitting device according to claim 1,
    wherein the resin layer includes a fibrous body.

25. A light-emitting device comprising:
a substrate having a light-transmitting property with respect to visible light;
a first adhesive layer over the substrate;
an insulating layer over the first adhesive layer;
a transistor over the insulating layer;
an interlayer insulating layer covering the transistor;
a light-emitting element comprising a first electrode over the interlayer insulating layer, a second electrode facing the first electrode, and a layer including an organic compound having a light-emitting property between the first electrode and the second electrode, the first electrode being electrically connected to a source electrode or a drain electrode of the transistor;
a second adhesive layer over the second electrode;
a metal substrate over the second adhesive layer;
a resin layer over the metal substrate; and
a heat radiation material layer formed over the resin layer,
wherein the substrate includes an inorganic filler having a particle diameter of 40 nm or less, and
wherein the heat radiation material layer is a titanium oxide layer, an iron oxide layer, an aluminum oxide layer, a copper oxide layer, or a ceramic material layer.

26. The light-emitting device according to claim 25, further comprising:
a pixel portion including the light-emitting element and the transistor; and
a driver circuit portion including a second transistor and being provided outside the pixel portion,
wherein the transistor in the pixel portion and the second transistor in the driver circuit portion are formed in same steps.

27. The light-emitting device according to claim 25, wherein crystalline silicon is used in the transistor.

28. The light-emitting device according to claim 25, wherein an oxide semiconductor is used in the transistor.

29. The light-emitting device according to claim 25, wherein a film sealing layer is formed between the second electrode of the light-emitting element and the second adhesive layer.

30. The light-emitting device according to claim 25, wherein the metal substrate comprises a material selected from stainless steel, aluminum, copper, nickel, and an aluminum alloy.

31. The light-emitting device according to claim 25, wherein the first adhesive layer comprises at least one selected from an epoxy resin, an acrylic resin, a silicone resin, and a phenol resin.

32. The light-emitting device according to claim 25, wherein the first adhesive layer includes a thermally conductive filler.

33. The light-emitting device according to claim 32, wherein a thermal conductivity of the thermally conductive filler is higher than a thermal conductivity of another material used in the first adhesive layer.

34. The light-emitting device according to claim 25, wherein the second adhesive layer comprises at least one selected from an epoxy resin, an acrylic resin, a silicone resin, and a phenol resin.

35. The light-emitting device according to claim 25, wherein the second adhesive layer includes a thermally conductive filler.

36. The light-emitting device according to claim 35, wherein a thermal conductivity of the thermally conductive filler is higher than a thermal conductivity of another material used in the second adhesive layer.

37. The light-emitting device according to claim 25, wherein the resin layer includes at least one thermosetting resin selected from an epoxy resin, an acrylic resin, a silicone resin, a phenol resin, and a polyester resin, or includes at least one thermoplastic resin selected from polypropylene, polyethylene, polycarbonate, polystyrene, polyamide, polyetherketone, a fluorine resin, and polyethylenenaphthalate.

38. The light-emitting device according to claim 25, wherein at least one of the substrate having the light-transmitting property, the first adhesive layer, and the second adhesive layer further includes a fibrous body.

39. The light-emitting device according to claim 38, wherein the fibrous body is a glass fiber.

40. The light-emitting device according to claim 25, wherein a waterproof layer is formed between the substrate having the light-transmitting property and the first adhesive layer.

41. The light-emitting device according to claim 40, wherein the waterproof layer is a layer including silicon and nitrogen or a layer including aluminum and nitrogen.

42. The light-emitting device according to claim 25, wherein the substrate having the light-transmitting property includes a surface facing the metal substrate, and includes a surface opposite to the surface facing the metal substrate being provided with a coat layer.

43. The light-emitting device according to claim 42, wherein the coat layer has a property of transmitting visible light and high hardness.

44. The light-emitting device according to claim 42, wherein the coat layer is a conductive layer having a property of transmitting visible light.

45. The light-emitting device according to claim 25, wherein the insulating layer comprises a layer including silicon and nitrogen.

46. The light-emitting device according to claim 25, wherein the substrate has flexibility.

47. The light-emitting device according to claim 25, wherein the light-emitting device is a flexible light-emitting device.

48. An electronic device comprising the light-emitting device according to claim 25 in a display portion.

49. A lighting apparatus comprising the light-emitting device according to claim 25.

50. The light-emitting device according to claim 25, wherein a surface of the substrate is uneven.

51. The light-emitting device according to claim 25, wherein the resin layer includes a fibrous body.

52. A light-emitting device comprising:
a substrate having a light-transmitting property with respect to visible light;
a first adhesive layer over the substrate;
an insulating layer over the first adhesive layer;
a light-emitting element comprising a first electrode formed over the insulating layer, a second electrode facing the first electrode, and a layer including an organic compound having a light-emitting property between the first electrode and the second electrode,
a second adhesive layer over the second electrode;
a metal substrate having a thickness greater than or equal to 10 μm and less than or equal to 200 μm over the second adhesive layer;
a resin layer over the metal substrate; and
a heat radiation material layer over the resin layer,
wherein the substrate includes an inorganic filler having a particle diameter of 40 nm or less.

53. The light-emitting device according to claim 52, wherein a film sealing layer is formed between the second electrode of the light-emitting element and the second adhesive layer.

54. The light-emitting device according to claim 52, wherein the first adhesive layer includes a thermally conductive filler.

55. The light-emitting device according to claim 54, wherein a thermal conductivity of the thermally conductive filler is higher than a thermal conductivity of another material used in the first adhesive layer.

56. The light-emitting device according to claim 52, wherein the second adhesive layer includes a thermally conductive filler.

57. The light-emitting device according to claim 56, wherein a thermal conductivity of the thermally conductive filler is higher than a thermal conductivity of another material used in the second adhesive layer.

58. The light-emitting device according to claim 52, wherein the resin layer includes at least one thermosetting resin selected from an epoxy resin, an acrylic resin, a silicone resin, a phenol resin, and a polyester resin, or includes at least one thermoplastic resin selected from polypropylene, polyethylene, polycarbonate, polystyrene, polyamide, polyetherketone, a fluorine resin, and polyethylenenaphthalate.

59. The light-emitting device according to claim 52, wherein at least one of the substrate having the light-transmitting property, the first adhesive layer, and the second adhesive layer further includes a fibrous body.

60. The light-emitting device according to claim 59, wherein the fibrous body is a glass fiber.

61. The light-emitting device according to claim 52, wherein a waterproof layer is formed between the substrate having the light-transmitting property and the first adhesive layer.

62. The light-emitting device according to claim 61, wherein the waterproof layer is a layer including silicon and nitrogen or a layer including aluminum and nitrogen.

63. The light-emitting device according to claim 52, wherein the substrate having the light-transmitting property includes a surface facing the metal substrate, and includes a surface opposite to the surface facing the metal substrate being provided with a coat layer.

64. The light-emitting device according to claim 63, wherein the coat layer has a property of transmitting visible light and high hardness.

65. The light-emitting device according to claim 63, wherein the coat layer is a conductive layer having a property of transmitting visible light.

66. The light-emitting device according to claim 52, wherein the insulating layer comprises a layer including silicon and nitrogen.

67. The light-emitting device according to claim 52, wherein the substrate has flexibility.

68. The light-emitting device according to claim 52, wherein the light-emitting device is a flexible light-emitting device.

69. An electronic device comprising the light-emitting device according to claim 52 in a display portion.

70. A lighting apparatus comprising the light-emitting device according to claim 52.

71. The light-emitting device according to claim 52, wherein a surface of the substrate is uneven.

72. The light-emitting device according to claim 52, wherein the resin layer includes a fibrous body.

73. A light-emitting device comprising:
a substrate having a light-transmitting property with respect to visible light;
a first adhesive layer over the substrate;
an insulating layer over the first adhesive layer;
a transistor over the insulating layer;
an interlayer insulating layer covering the transistor;
a light-emitting element comprising a first electrode over the interlayer insulating layer, a second electrode facing the first electrode, and a layer including an organic compound having a light-emitting property between the first electrode and the second electrode, the first electrode being electrically connected to a source electrode or a drain electrode of the transistor;
a second adhesive layer over the second electrode;
a metal substrate having a thickness greater than or equal to 10 μm and less than or equal to 200 μm over the second adhesive layer;
a resin layer over the metal substrate; and
a heat radiation material layer formed over the resin layer,
wherein the substrate includes an inorganic filler having a particle diameter of 40 nm or less.

74. The light-emitting device according to claim 73, wherein crystalline silicon is used in the transistor.

75. The light-emitting device according to claim 73, wherein an oxide semiconductor is used in the transistor.

76. The light-emitting device according to claim 73, wherein a film sealing layer is formed between the second electrode of the light-emitting element and the second adhesive layer.

77. The light-emitting device according to claim 73, wherein the first adhesive layer includes a thermally conductive filler.

78. The light-emitting device according to claim 77, wherein a thermal conductivity of the thermally conductive filler is higher than a thermal conductivity of another material used in the first adhesive layer.

79. The light-emitting device according to claim 73, wherein the second adhesive layer includes a thermally conductive filler.

80. The light-emitting device according to claim 79, wherein a thermal conductivity of the thermally conductive filler is higher than a thermal conductivity of another material used in the second adhesive layer.

81. The light-emitting device according to claim 73, wherein the resin layer includes at least one thermosetting resin selected from an epoxy resin, an acrylic resin, a silicone resin, a phenol resin, and a polyester resin, or includes at least one thermoplastic resin selected from polypropylene, polyethylene, polycarbonate, polystyrene, polyamide, polyetherketone, a fluorine resin, and polyethylenenaphthalate.

82. The light-emitting device according to claim 73, wherein at least one of the substrate having the light-transmitting property, the first adhesive layer, and the second adhesive layer further includes a fibrous body.

83. The light-emitting device according to claim 82, wherein the fibrous body is a glass fiber.

84. The light-emitting device according to claim 73, wherein a waterproof layer is formed between the substrate having the light-transmitting property and the first adhesive layer.

85. The light-emitting device according to claim 84, wherein the waterproof layer is a layer including silicon and nitrogen or a layer including aluminum and nitrogen.

86. The light-emitting device according to claim 73, wherein the substrate having the light-transmitting property includes a surface facing the metal substrate, and includes a surface opposite to the surface facing the metal substrate being provided with a coat layer.

87. The light-emitting device according to claim 86, wherein the coat layer has a property of transmitting visible light and high hardness.

88. The light-emitting device according to claim 86, wherein the coat layer is a conductive layer having a property of transmitting visible light.

89. The light-emitting device according to claim 73, wherein the insulating layer comprises a layer including silicon and nitrogen.

90. The light-emitting device according to claim 73, wherein the substrate has flexibility.

91. The light-emitting device according to claim 73, wherein the light-emitting device is a flexible light-emitting device.

92. An electronic device comprising the light-emitting device according to claim 73 in a display portion.

93. A lighting apparatus comprising the light-emitting device according to claim 73.

94. The light-emitting device according to claim 73, wherein a surface of the substrate is uneven.

95. The light-emitting device according to claim 73, wherein the resin layer includes a fibrous body.

* * * * *